United States Patent
Tao et al.

(10) Patent No.: US 9,401,708 B2
(45) Date of Patent: Jul. 26, 2016

(54) GATE DRIVE UNIT AND METHOD FOR CONTROLLING A GATE DRIVE UNIT

(71) Applicant: General Electric Company, Schenectady, NY (US)

(72) Inventors: Fengfeng Tao, Niskayuna, NY (US); Ahmed Elasser, Niskayuna, NY (US); Mohammed Agamy, Niskayuna, NY (US); Patrick Kirlew, Jacksonville, FL (US)

(73) Assignee: General Electric Company, Niskayuna, NY (US)

( * ) Notice: Subject to any disclaimer, the term of this patent is extended or adjusted under 35 U.S.C. 154(b) by 148 days.

(21) Appl. No.: 14/282,343

(22) Filed: May 20, 2014

(65) Prior Publication Data

US 2015/0341028 A1 Nov. 26, 2015

(51) Int. Cl.

| | |
|---|---|
| *H03K 17/30* | (2006.01) |
| *H03K 17/292* | (2006.01) |
| *H03K 17/0812* | (2006.01) |
| *H03K 17/081* | (2006.01) |
| *H03K 17/0412* | (2006.01) |
| *H03K 17/60* | (2006.01) |
| *H03K 17/73* | (2006.01) |

(52) U.S. Cl.
CPC .......... *H03K 17/305* (2013.01); *H03K 17/0412* (2013.01); *H03K 17/08108* (2013.01); *H03K 17/08124* (2013.01); *H03K 17/292* (2013.01); *H03K 17/601* (2013.01); *H03K 17/73* (2013.01)

(58) Field of Classification Search
CPC combination set(s) only.
See application file for complete search history.

(56) References Cited

U.S. PATENT DOCUMENTS

| | | | |
|---|---|---|---|
| 3,928,775 A | | 12/1975 | Steigerwald |
| 4,284,911 A | * | 8/1981 | McKeon ................. H03K 17/73 327/442 |
| 4,297,594 A | | 10/1981 | Onda et al. |

(Continued)

FOREIGN PATENT DOCUMENTS

| | | |
|---|---|---|
| EP | 0416933 A2 | 3/1991 |
| EP | 0489945 A1 | 6/1992 |
| WO | 0113501 A1 | 2/2001 |

OTHER PUBLICATIONS

Shah, P.B. et al., "Simulated turn-off of 4H-SiC gate turn-off thyristors with gate electrodes on the p-base or the n-base, Electron Device Letters", IEEE Xplore, Nov. 1999, pp. 577-579, vol. 20, Issue: 11.

(Continued)

*Primary Examiner* — Thomas J Hiltunen
(74) *Attorney, Agent, or Firm* — Robert M. McCarthy

(57) ABSTRACT

A gate drive unit includes a charging device, a switch, and a timing module. The charging device is conductively coupled with an electrical energy source and a power switch between the electric energy source and the charging device. The switch closes to transfer electrical energy from the energy source to the charging device. The timing module is configured to close the switch to direct the electrical energy from the electrical energy source to the charging device for a designated charging time period in order to charge the charging device with the electrical energy while the power switch is in an OFF state. The timing module opens the switch to cause the electrical energy stored in the charging device to be transferred out of the charging device in the form of a trigger current that is conducted to a gate terminal of the power switch to activate the power switch to an ON state from the OFF state.

20 Claims, 11 Drawing Sheets

(56) References Cited

U.S. PATENT DOCUMENTS

| | | | |
|---|---|---|---|
| 4,527,216 A * | 7/1985 | Stammely | H01H 47/226 361/156 |
| 4,675,543 A | 6/1987 | Mitsuoka | |
| 4,713,719 A * | 12/1987 | Kugelman | H02H 3/087 327/466 |
| 5,077,487 A * | 12/1991 | Iida | H03K 17/04126 327/443 |
| 5,237,225 A * | 8/1993 | Gruning | H03K 17/0403 327/170 |
| 5,539,217 A | 7/1996 | Edmond et al. | |
| 5,585,758 A | 12/1996 | Prines et al. | |
| 5,684,426 A * | 11/1997 | De Doncker | H03K 17/732 327/440 |
| 6,107,649 A | 8/2000 | Zhao | |
| 6,163,200 A * | 12/2000 | Iijima | H03K 17/0403 257/147 |
| 6,404,265 B1 * | 6/2002 | Guido, Jr. | H02M 1/08 327/443 |
| 6,423,986 B1 | 7/2002 | Zhao | |
| 6,472,686 B1 | 10/2002 | Shah | |
| 6,597,555 B2 | 7/2003 | Gruening et al. | |
| 6,703,642 B1 | 3/2004 | Shah | |
| 6,900,477 B1 | 5/2005 | Shah | |
| 7,084,528 B2 * | 8/2006 | Hatano | H03K 17/105 307/106 |
| 7,391,057 B2 | 6/2008 | Ryu et al. | |
| 7,525,122 B2 | 4/2009 | Ring et al. | |
| 7,598,576 B2 | 10/2009 | Ward, III et al. | |
| 7,615,801 B2 | 11/2009 | Ryu et al. | |
| 7,696,584 B2 | 4/2010 | Henning et al. | |
| 7,851,274 B1 | 12/2010 | Shah | |
| 7,855,401 B2 | 12/2010 | Sheppard et al. | |
| 7,858,460 B2 | 12/2010 | Ring et al. | |
| 8,110,835 B2 * | 2/2012 | Kumar | H05B 33/0818 257/79 |
| 9,088,170 B2 * | 7/2015 | Kataoka | H02J 7/0052 |
| 2006/0261346 A1 | 11/2006 | Ryu et al. | |
| 2010/0221155 A1 * | 9/2010 | Shimizu | A61L 2/14 422/186.05 |
| 2012/0195074 A1 * | 8/2012 | Lehn | H02M 3/155 363/17 |

OTHER PUBLICATIONS

Burke, T. et al., "Silicon carbide thyristors for power applications, Pulsed Power Conference, 1995. Digest of Technical Papers.", Tenth IEEE International, Jul. 3-6, 1995, pp. 327-335, vol. 1.

PCT Search Report and Opinion issued in connection with corresponding Application No. PCT/US2015/030695 on Aug. 14, 2015.

\* cited by examiner

GATE DRIVE UNIT AND METHOD FOR CONTROLLING A GATE DRIVE UNIT

FIELD

Embodiments of the subject matter described herein relate to power semiconductor switches, such as switches used to control conduction of electric current in a circuit.

BACKGROUND

Switches in circuits alternate between activated or on states, where the switches are closed to conduct electric current from a source of the current to one or more loads, and deactivated or off states, where the switches are opened to prevent conduction of the electric current.

In some power supply circuits, such as circuits that supply on the order of several hundred to several thousand amps to power loads, power semiconductor switches such as thyristors are used to control the conduction of current to the loads. These thyristors may be formed from Silicon (Si) or Silicon Carbide (SiC) in order to reliably withstand the large currents supplied to the loads. These thyristors, however, can require the application of trigger currents having large slew rates to gates of the thyristors in order to activate the thyristors. In order to provide sufficiently large slew rates, however, very large current pulses may need to be applied to the gates of the thyristors.

These large current pulses can impart significant stress to the thyristors. This stress can lead to damage and/or destruction of the thyristors. Additionally, the circuitry components needed to supply such large current pulses can increase the cost and complexity of the gate drivers that supply the trigger currents to the gates of the thyristors.

BRIEF DESCRIPTION

In one example of the inventive subject matter described herein, a gate drive unit includes a charging device, a first switch, and one or more timing modules. The charging device is conductively coupled with an electric energy source and a power switch between the electric energy source and the charging device. The power switch configured to be switched between an ON state and an OFF state to control conduction of electric current from a power supply to a load. The charging device is configured to store electric energy supplied by the electric energy source when the electric energy is conducted to the charging device. The first switch is conductively coupled with the electric energy source and the charging device between the electric energy source and the charging device. The first switch is configured to close and then to conduct the electric energy from the electric energy source to the charging device. The first switch also is configured to open to prevent conduction of the electric energy from the electric energy source to the charging device. The one or more timing modules are coupled with the first switch and configured to control closing or opening of the first switch. The one or more timing modules are configured to close the first switch to direct the electric energy from the electric energy source to the charging device for a designated charging time period in order to charge the charging device with the electric energy while the power switch is in the OFF state. The one or more timing modules are also configured to open the first switch to cause the electric energy stored in the charging device to be conducted out of the charging device as a trigger current that is conducted to a gate terminal of the power switch to activate the power switch to the ON state from the OFF state.

In another example of the inventive subject matter described herein, a method for controlling a gate drive unit includes activating a charging switch in the gate drive unit to conduct a charging current from an electric energy source to a charging device of the gate drive unit. The charging current charges the charging device with electric energy. The method also includes, responsive to an amount of the electric energy stored in the charging device reaching or exceeding a designated upper limit, deactivating the charging switch and activating a discharge switch in the gate drive unit to discharge the electric energy stored in the charging device as a trigger current. The trigger current can be conducted to a gate terminal of a power switch to activate the power switch. The method also can include, responsive to the power switch being activated by the trigger current, deactivating the discharge switch to prevent further conduction of the trigger current to the gate terminal from the charging device and closing a dissipation switch to discharge a remaining amount of the electric energy stored in the charging device away from the gate terminal of the power switch.

In another example of the inventive subject matter described herein, another gate drive unit includes an inductive device, a first switch, and a second switch. The inductive device is configured to store electric energy when the inductive device receives a charging current from an electric energy source, the inductive device also configured to discharge the electric energy that is stored in the inductive device as a trigger current that is conducted to a gate terminal of a thyristor device to activate the thyristor device. The first switch is conductively coupled with the energy source and the inductive device between the energy source and the inductive device. The second switch is conductively coupled with the inductive device and the energy source between the inductive device and the energy source. The first switch is configured to be closed while the second switch is open to conduct the charging current from the energy source to the inductive device until the inductive device is charged with at least a designated upper level of the electric energy. The first switch also is configured to open when the second switch closes to discharge the electric energy that is stored in the inductive device to the gate terminal of the thyristor device as a trigger current that activates the thyristor device.

BRIEF DESCRIPTION OF THE DRAWINGS

The subject matter described herein will be better understood from reading the following description of non-limiting embodiments, with reference to the attached drawings, wherein below.

DETAILED DESCRIPTION

One or more embodiments of the inventive subject matter described herein relate to gate drive units and methods that are more reliable in turning on (e.g., closing) power semiconductor switches, such as thyristors or other types of switches, and/or that may more quickly turn on such switches when compared to some known power switches. The switches may be used to control conduction of relatively large amounts of electric current, such as 1,000 Amps or more. Optionally, the switches can be used to control conduction of smaller amounts of electric current. While the description herein focuses on semiconductor power switches like thyristors, not all embodiments of the inventive subject matter are so limited. Various aspects of the inventive subject matter described herein may be used to control activation or deactivation of other types of power semiconductor switches.

Figure 1:
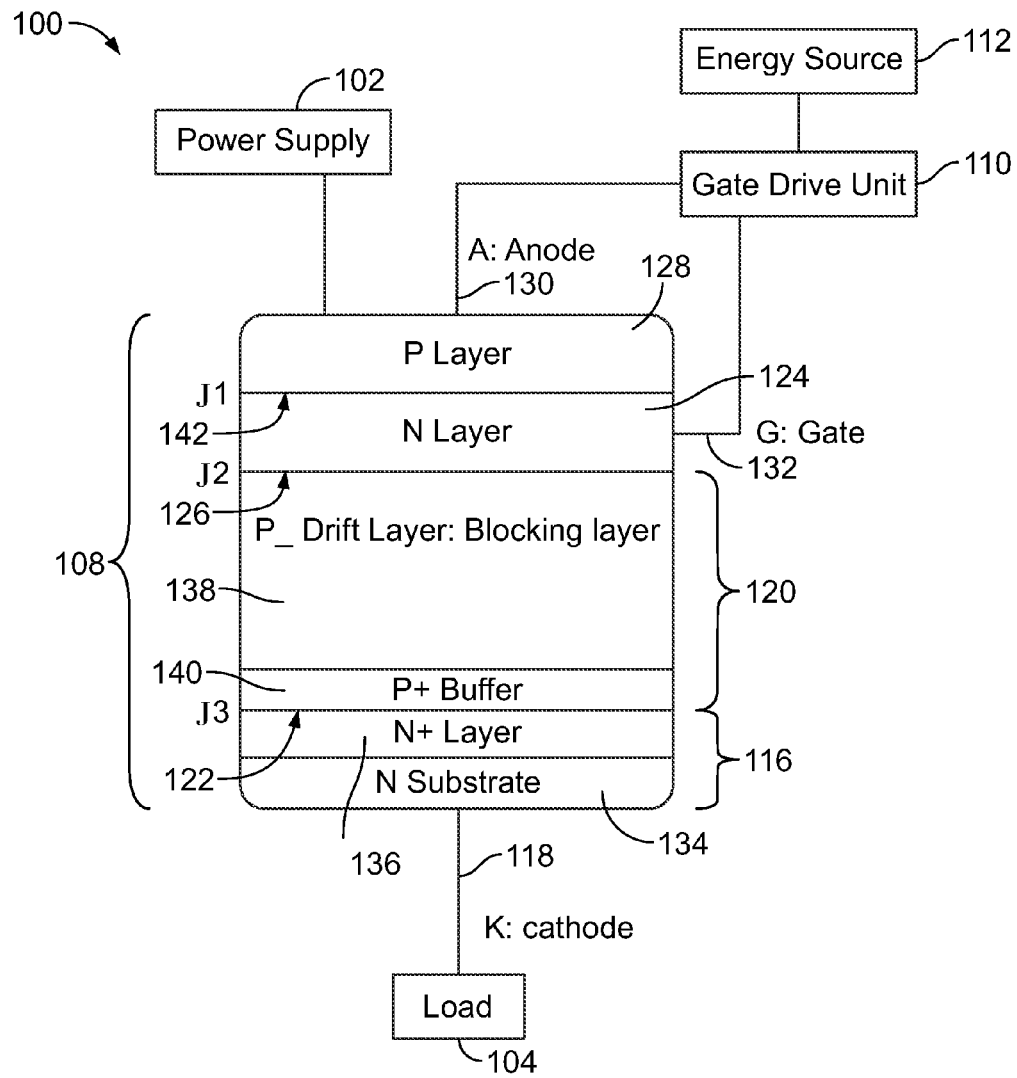
FIG. 1 illustrates a schematic diagram of a power supply circuit according to one example of the inventive subject matter described herein.

FIG. 1 illustrates a schematic diagram of a power supply circuit 100 according to one example of the inventive subject matter described herein. The circuit 100 conductively couples one or more power supplies 102 with one or more loads 104 to power the load 104. The power supply 102 can represent an alternator, generator, utility grid, battery, or the like, that generates or supplies electrical current or voltage to power the load 104. The load 104 can represent systems or devices that consume electrical energy (e.g., a load current and/or voltage) to perform work. In one aspect, the power supply 102 provides a relatively large amount of Amps to the load 104, such as several hundred Amps or more, a thousand Amps or more, or another amount (greater or lesser) of Amps.

The circuit 100 includes at least one power switch 108 that alternates between states to control conduction of current from the power supply 102 to the load 104. For example, a power switch 108 can be activated to an active or "ON" state that conducts current from the power supply 102 through the power switch 108 to the load 104, and can be deactivated to a deactivated or "OFF" state that prevents conduction of the current from the power supply 102 through the power switch 108 to the loads 104. In the illustrated example, the power switch 108 is a semiconductor power switch, such as a thyristor. Optionally, the power switch 108 may be a SiC thyristor. Alternatively, the power switch 108 can be another type of switch using other materials such as GaN, GaAs, or Diamond or any other Wide Bandgap (WBG) material.

A gate drive unit 110 extracts a trigger current or gate current from the gate terminal of the power switch 108 to turn the power switch into the active or ON state and allows current to be conducted through the power switch 108 to the load 104. The electrical energy used to create the trigger current can be provided from an electrical energy source 112 (e.g., "Energy Source" in FIG. 1), such as a utility grid, battery, alternator, generator, or the like. Once the power switch 108 is activated, the current from the power supply 102 may continue to be conducted through the power switch 108 to the load 104. For example, as long as the power switch 108 is forward biased, the power switch 108 may continue to conduct electrical current from the power supply 102 to the load 104.

In the illustrated example, the power switch 108 is a thyristor device formed from several alternating layers of doped semiconductor material. The power switch 108 includes a semiconductor substrate layer 134 that is doped with an n-type dopant. The substrate layer 116 which consists of the semiconductor layer 134 and a heavily doped n-type thin buffer layer 136 is conductively connected with the load 104 by a conductive cathode terminal 118 (and/or one or more other conductive pathways not shown in FIG. 1). A semiconductor blocking layer 120 that is doped with a p-type dopant is coupled with the substrate layer 134. The interface between the semiconductor layer 116 and the blocking layer 120 forms a semiconductor junction 122, which is referred to as a third junction or J3 junction A semiconductor gate layer 124 that is doped with an n-type dopant is coupled with the blocking layer 120 on a side that is opposite to the substrate layer 116. For example, the p-doped blocking layer 120 is disposed between and adjacent to the n-doped gate layer 124 and the n-doped substrate layer 116. The interface between the gate layer 124 and the blocking layer 120 forms another semiconductor junction 126, which is referred to as a second junction or J2 junction. The gate layer 124 is conductively coupled with the gate drive unit 110 by a conductive gate terminal 132 (and/or one or more other conductive pathways not shown in FIG. 1).

A semiconductor anode layer 128 that is doped with a p-type dopant is coupled with the gate layer 124. The anode layer 128 is also conductively coupled with the gate drive unit 110 by a conductive anode terminal 130 (and/or one or more other conductive pathways not shown in FIG. 1). The anode layer 128 is conductively coupled with the power supply 102 by one or more conductive pathways 144 (e.g., one or more wires, cables, busses, or the like). The interface between the anode layer 128 and the gate layer 124 forms another semiconductor junction 142, which is referred to as a first junction or J1 junction. Due to the arrangement of the layers in the power switch 108, the power switch 108 is referred to as an N-P-N-P semiconductor device.

The power switch 108 is referred to as an asymmetrical semiconductor device because the power switch 108 blocks the electrical voltage in one direction (anode-cathode) but not in the opposite direction (cathode-anode). For example, the substrate layer 116 includes an n-doped sublayer 134 and an adjacent n+ doped layer 136, and/or the blocking layer 120 includes a p-doped drift layer 138 and an adjacent p+ buffer layer 140 (which is also adjacent to the n+ doped layer 136). Some leakage current occurs while the power switch 108 is at the OFF-state, but this current is significantly less than the main current conducted when the power switch 108 is in the ON state. These sublayers can allow current to be conducted through the power switch 108 from the anode terminal 130 to the cathode terminal 118 through the power switch 108 when the power switch 108 is turned ON, but not from the cathode terminal 118 to the anode terminal 130 through the power switch 108.

In operation, the power switch 108 may be in an OFF or deactivated state to block conduction of electric current from the power supply 102 to the load 104. In contrast to other known power switches (such as Si thyristors which has an opposite arrangement of n- and p-doped layers), a negative potential ($V_g$) is applied to the gate layer 124 so that the gate terminal 132 and gate layer 124 have a negative potential with respect to the anode terminal 130 and the anode layer 128. This negative potential turns the power switch 108 ON. The negative potential can be applied to the gate 124 by conducting a gate current or trigger current ($I_g$) out of the gate terminal 132 and into the thyristor 108 through the anode terminal 130.

As described herein, the gate drive unit 110 controls the flow of electrical energy, such as voltage, from the energy source 112 to generate the trigger current that is then conducted out of the power switch 108 at the gate terminal 132. The gate drive unit 110 includes and/or represents one or more hardware or hardwired circuits or circuitry that include and/or are connected with one or more processors, such as one or more microprocessors, field programmable gate arrays (FPGAs), or the like. Although the energy source 112 is shown as being separate from the gate drive unit 110 in FIG. 1, optionally, the gate drive unit 110 may include the energy source 112.

The gate drive unit 110 generates the trigger current at a relatively large slew rate that is sufficiently fast to activate the power switch 108 quickly, without requiring the use of significantly large trigger currents being extracted from the gate terminal 132 of the power switch 108. As a result, the gate drive unit 110 reliably and quickly activates the power switch 108, without requiring the use of excessively large current pulses which could stress and/or damage the power switch 108. As an example, the gate drive unit 110 charges an inductive element and then diverts the charge in the inductive element (e.g., directly) to the power switch 108 to achieve relatively fast slew rates.

Figure 2:
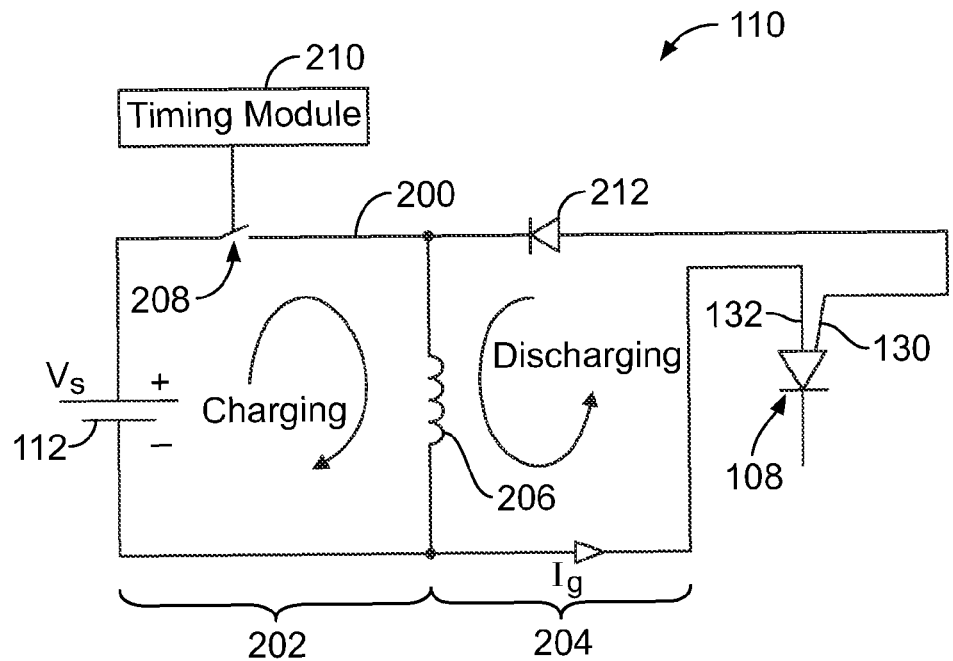
FIG. 2 illustrates a circuit diagram of a gate drive unit shown in FIG. 1 according to one example of the inventive subject matter described herein.

FIG. 2 illustrates a circuit diagram of the gate drive unit 110 according to one example of the inventive subject matter described herein. The gate drive unit 110 includes one or more conductive pathways 200 that conductively couple the energy source 112 with the gate terminal 132 and the anode terminal 130 of the power switch 108. In the illustrated example, the conductive pathways 200 of the gate drive unit 110 form conductive loop or ring circuits 202, 204 that are conductively coupled with each other.

A charging device 206 is conductively coupled with the energy source 112 and the power switch 108 in a location between the energy source 112 and the power switch 108. In the illustrated example, the charging device 206 is included in the conductive paths formed by both of the circuits 202, 204. For example, the charging device 206 can be parallel to the power switch 108 in the gate drive unit 110. The charging device 206 receives and stores at least some of the electrical energy supplied by the energy source 112. The charging device 206 is an inductor or any other device capable of storing electrical energy.

A first internal switch 208 is conductively coupled with the energy source 112 and the charging device 206. The first switch 208 may be referred to as an internal switch because the switch 208 is integrated into the gate drive unit 110. As shown in FIG. 2, the first switch 208 is placed in the gate drive unit 110 in the circuit 202 between the energy source 112 and the charging device 206. The first switch 208 may include a semiconductor switch, such as a Metal Oxide Semiconductor Field Effect Transistor (MOSFET) or any other type of ON-OFF switch.

A timing module 210 controls the opening or closing of the first switch 208. The timing module 210 includes and/or represents one or more hardware or hardwired circuits or circuitry that include and/or are connected with one or more processors, such as one or more microprocessors, FPGAs, or the like. The timing module 210 monitors how long the first switch 208 (and/or other switches, as described herein) are open and/or closed, and opens or closes the first switch 208 (and/or other switches, as described herein) to control the charging of the charging device 206 and/or the conduction of a trigger current ($I_g$ in FIG. 2) out of the gate terminal 132 of the power switch 108.

The circuit 202 may be referred to as a charging circuit in that this circuit is used to transfer electrical energy (e.g., voltage and current) from the energy source 112 to the charging device 206 and to charge the charging device 206. In order to charge the charging device 206, the timing module 210 closes the first switch 208. While the first switch 208 is closed, electrical energy is transferred from the energy source 112 to the charging device 206.

A freewheeling diode 212 is provided in the gate drive unit 110. The freewheeling diode 212 is included in the circuit 204 to prevent the transfer of the electrical energy from the energy source 112 to the gate terminal 132 of the power switch 108 when the first switch 208 is closed. This diode 212 optionally is also referred to as a blocking diode.

The circuit 204 is referred to as a discharging circuit in that this circuit discharges the electric energy stored in the charging device 206 as the trigger current that is conducted out of the gate terminal 132 of the power switch 108. As described above, this trigger current can switch the power switch 108 ON to conduct the current from the power supply 102 (shown in FIG. 1) to the load 104 (shown in FIG. 1). The charging device 206 discharges the trigger current directly out of the gate terminal 132, such as by conducting the trigger current from the charging device 206 to the anode terminal without conducting the trigger current through components other than the conductive pathways that connect the charging device 206 to the gate terminal 132 (e.g., without conducting the trigger current through resistors, inductors, capacitors, switches, or the like).

Figure 3:
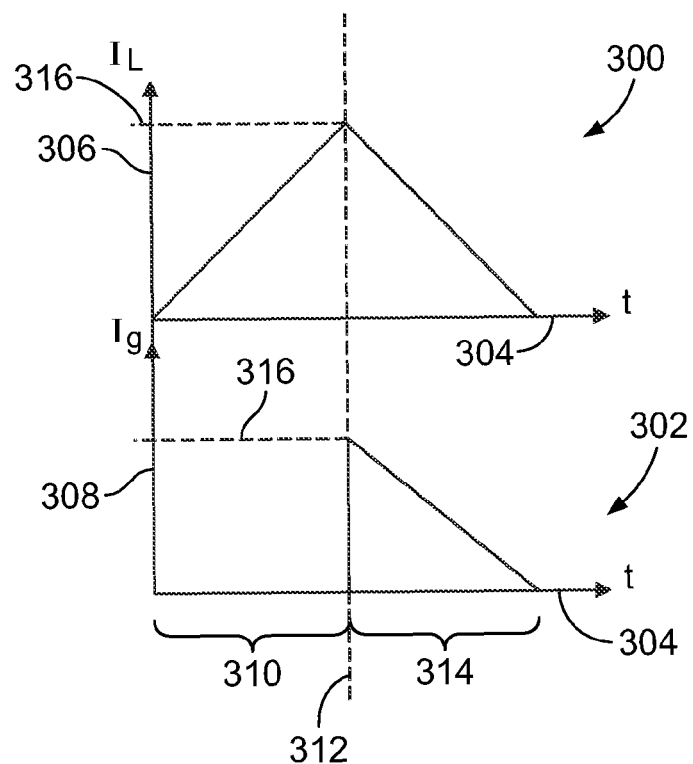
FIG. 3 illustrates timing diagrams for use by the gate drive unit shown in FIG. 1 to control the charging and discharging of a charging device shown in FIG. 2 according to one example of the inventive subject matter described herein.

With continued reference to the gate drive unit 110 shown in FIG. 2, FIG. 3 illustrates the timing diagrams 300, 302 for the control of the charging and discharging of device 206 according to one example of the inventive subject matter described herein. The timing diagrams 300, 302 are shown alongside horizontal axes 304 representative of time and vertical axes 306, 308. The vertical axis 306 of the timing diagram 300 represents magnitudes of electrical current conducted to the charging device 206 in the charging circuit 202 to charge the charging device 206 (e.g., a charging current $I_L$). The vertical axis 308 of the timing diagram 302 represents the magnitude of the electrical current that is discharged from the charging device 206 into the discharging circuit 204 to switch the power switch 108 to the ON state (e.g., the trigger current $I_g$). The scales of the vertical axes 306, 308 may differ from each other or be the same.

In normal operation, during a charging time period 310, the timing module 210 closes the first switch 208 to cause the charging current ($I_L$) to be conducted into the charging circuit 202 from the energy source 112 to the charging device 206. At least some of this charging current ($I_L$) is stored into the charging device 206 as a stored electrical energy. The discharging circuit 204 prevents this current from being conducted to the power switch 108 (e.g., the freewheeling diode 212 prevents this). The charging current is transferred to the charging device 206 until the stored current or energy in the charging device 206 reaches a designated upper level 316, which may be referred to as a peak charging current ($I_{pk}$), even though the maximum charging current that the charging device 206 is capable of storing may be the same as the peak charging current ($I_{pk}$) or may be larger than the peak charging current ($I_{pk}$). The gate drive unit determines when the stored charging current ($I_L$) reaches the designated upper level 316 based on the rate at which the charging current ($I_L$) is stored into the charging device 206. For example, the rate at which the charging current ($I_L$) is stored in the charging device 206 is based on:

$$\text{Rate} = \frac{V}{L} \quad \text{(Eqn. 1)}$$

where Rate represents the rate at which the charging device 206 is charged, V represents the voltage applied to the charging device 206, and L represents the inductance of the charging device 206. Optionally, the rate at which the charging device 206 is charged may be represented by or based on another relationship. The timing module 210 tracks the passage of time in order to calculate when the charging current ($I_L$) that is stored into the charging device 206 reaches the designated upper level 316. Optionally, the timing module 210 may measure the amount of charging current ($I_L$) that is stored in the charging device 206, such as by using one or more ammeters or other sensors.

At an activation time 312, the timing module 210 opens the first switch 208. Upon opening the first switch 208, the charging current ($I_L$) is no longer conducted in the charging circuit 202 from the energy source 112 to the charging device 206. Instead, the stored electric energy in the charging device 206 is now conducted through the discharging circuit 204 to the power switch 108 as the trigger current ($I_g$). The trigger current ($I_g$) can be conducted at a relatively high slew rate to quickly turn ON the power switch 108. As described above, this trigger current can be conducted out of the power switch 108 through the gate terminal 132 of the power switch 108 in order to activate the power switch 108. The energy stored in the charging device 206 begins to dissipate due to this energy being conducted to the power switch as the trigger current. Consequently, both the charging current ($I_L$) and the trigger current ($I_g$) decrease following the activation time 312 during a discharging time period 314. The power switch 108 is then activated and turned ON to conduct electric current from the power supply 102 to the load 104 as shown in FIG. 1.

Figure 4:
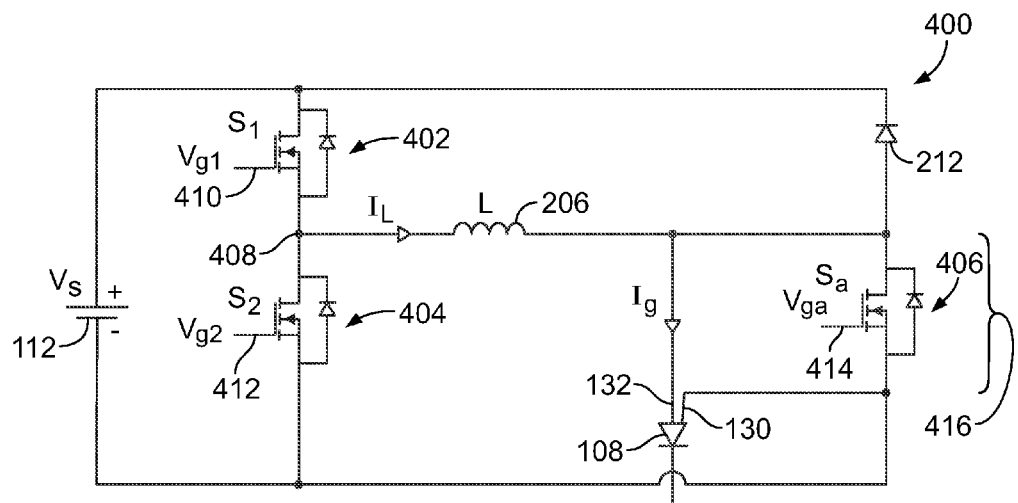
FIG. 4 illustrates another example of a gate drive unit according to another example of the inventive subject matter described herein.

FIG. 4 illustrates another example of a gate drive unit 400 according to another example of the inventive subject matter described herein. The gate drive unit 400 may be used as the gate drive unit 110 shown in FIG. 1. The gate drive unit 400 includes first, second, and third switches 402, 404, 406 conductively coupled with the charging device 206, the power switch 108, and the energy source 112. The switches 402, 404, 406 may be MOSFETs or other types of switches. Although not shown in FIG. 4, the timing module 210 (shown in FIG. 2) may be connected with the switches 402, 404, 406 to control when the switches 402, 404, 406 are open or closed. Optionally, several timing modules 210 may be provided, with one or more of the timing modules 210 each controlling the opening or closing of a single switch 402, 404, 406 or multiple switches 402, 404, 406.

The first and second switches 402, 404 are conductively coupled with the energy source 112 and the power switch 108 between the energy source 112 and the power switch 108. The charging device 206 is conductively coupled with the first and second switches 402, 404 at a node 408 that is disposed between the first and second switches 402, 404. The third switch 406 is conductively coupled with the charging device 206, the power switch 108, and (optionally) the diode 212 between these components. The diode 212 can limit the electric energy supplied to the power switch 108 (e.g., the potential across the anode and gate terminals of the power switch 108) to the electric energy supplied by the energy source 112 (e.g., to the supply voltage $V_s$). Alternatively, two or more diodes 212 may be provided in series between the switch 406 and the switch 402.

The first and third switches 402, 406 may be referred to as input switches, as these switches 402, 406 control the electric energy that is conducted to the charging device 206. For example, the input switches 402, 406 can be opened or closed by the timing module 210 to control conduction of the charging current ($I_L$) to the charging device 206. The second switch 404 can be referred to as a gate switch because the third switch 406 is controlled by the timing module 210 to control when the trigger current ($I_g$) is applied to the power switch 108.

In one aspect, the location of the charging device 206 can vary from the position shown in FIG. 4. For example, the charging device 206 can be located farther from the power switch 108. The location of the third switch 406 may be relatively close to the power switch 108 in order to reduce inductance in a conductive loop circuit 416 in the gate driver unit 400. For example, the third switch 406 may be closer to the power switch 108 than one or more, or all, other components of the gate drive unit 400.

Figure 5:
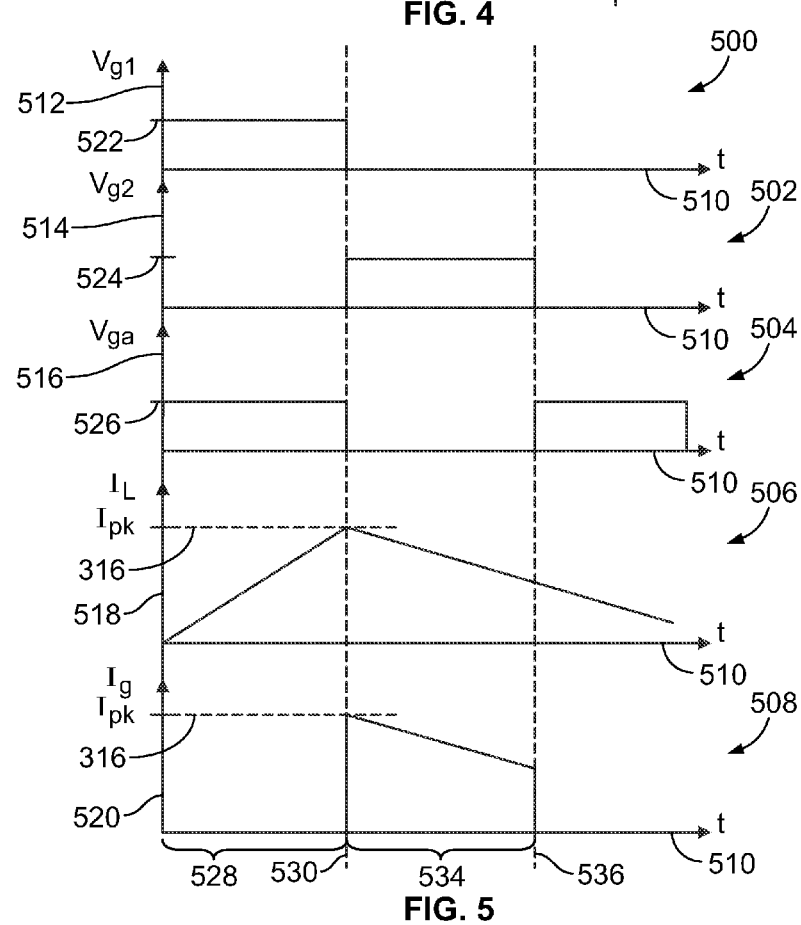
FIG. 5 illustrates timing diagrams for use by the gate drive unit shown in FIG. 4 to control the charging and discharging of the charging device shown in FIG. 4 according to one example of the inventive subject matter described herein.

With continued reference to the circuit diagram shown in FIG. 4, FIG. 5 illustrates timing diagrams 500, 502, 504, 506, 508 for control of charging and discharging the charging device 206 using the gate drive unit 400 according to one example of the inventive subject matter described herein. The timing diagrams 500, 502, 504, 506, 508 are shown alongside horizontal axes 510 representative of time and vertical axes 512, 514, 516, 518, 520.

The vertical axis 512 of the timing diagram 500 represents magnitudes of electric waveforms (e.g., a gate voltage $V_{g1}$) conducted to a gate terminal 410 of the first switch 402. As shown in the timing diagram 500, the gate voltage $V_{g1}$ can be increased to a designated level 522 to close the first switch 402 and decreased to another level or zero to open the first switch 402. The gate voltage $V_{g1}$ may be provided from the energy source 112 and/or from another energy source. The timing module 210 can control the conduction of the gate voltage $V_{g1}$, such as by one or more other switches or components.

The vertical axis 514 of the timing diagram 502 represents magnitudes of electrical waveforms (e.g., a gate voltage $V_{g2}$) conducted to a gate terminal 412 of the second switch 404. As shown in the timing diagram 502, the gate voltage $V_{g2}$ can be increased to a designated level 524 to close the second switch 404 and decreased to another level or zero to open the second switch 404. The gate voltage $V_{g2}$ may be provided from the energy source 112 and/or from another energy source. The timing module 210 can control the conduction of the gate voltage $V_{g2}$, such as by one or more other switches or components.

The vertical axis 516 of the timing diagram 504 represents magnitudes of electric energy (e.g., a gate voltage $V_{ga}$) conducted to a gate terminal 414 of the third switch 406. As shown in the timing diagram 504, the gate voltage $V_{ga}$ can be increased to a designated level 526 to close the third switch 406 and decreased to another level or zero to open the third switch 406. The gate voltage ($V_{ga}$) may be provided from the energy source 112 and/or from another energy source. The timing module 210 can control the conduction of the gate voltage $V_{ga}$, such as by one or more other switches or components.

The vertical axis 518 of the timing diagram 506 represents magnitudes of electrical waveforms conducted to the charging device 206 to charge the charging device 206 (e.g., a charging current $I_L$). The vertical axis 520 of the timing diagram 508 represents magnitudes of electrical waveforms that is discharged from the charging device 206 to the power switch 108 to switch the power switch 108 to the ON state (e.g., the trigger current $I_g$). The scales of the vertical axes 512, 514, 516 may differ from each other or be the same, and the scales of the vertical axes 518, 520 may differ or be the same.

In operation, to charge the charging device 206, the timing module 210 applies the gate voltage ($V_{g1}$) at or above the designated level 522 to the gate terminal 410 of the first switch 402 and the gate voltage ($V_{ga}$) at or above the designated level 526 to the gate terminal 414 of the third switch 406. Application of these gate voltages ($V_{g1}$) and ($V_{ga}$) causes the first and third switches 402, 406 to close. As shown in the timing diagram 502, the gate voltage ($V_{g2}$) of the second switch 404 remains below the designated level 524 and, as a result, the second switch 404 remains open.

The timing module 210 keeps the first and third switches 402, 406 closed and the second switch 404 open for a charging time period 528. During this charging time period, the electrical energy stored in the charging device 206 increases, as shown by the increase in the charging current ($I_L$) in the timing diagram 506. The stored electrical energy can continue to increase to the designated upper level ($I_{pk}$) 316.

At an activation time 530, the timing module 210 causes the charging current ($I_L$) to be discharged from the charging device 206 as the trigger current ($I_g$) to the power switch 108 to activate the power switch 108. The timing module 210 can cause the stored charging current ($I_L$) to be discharged as the trigger current ($I_g$) by opening the first and third switches 402, 406, and by closing the second switch 404. For example, the gate voltages ($V_{g1}$), ($V_{ga}$) can be removed from the gate terminals 410, 414 of the first and third switches 402, 406, and the gate voltage ($V_{g2}$) can be applied to the gate terminal 412 of the second switch 404. The charging current ($I_L$) is then discharged from the charging device 206 as the trigger current ($I_g$), as shown by the decrease in the charging current ($I_L$) during a discharging time period 534. The trigger current ($I_g$) can be conducted out of the gate terminal 132 of the power switch 108 to turn the power switch 108 ON. The trigger current ($I_g$) can be conducted at a relatively high slew rate to quickly turn ON the power switch 108. The charging current ($I_L$) and/or the trigger current ($I_g$) may decrease from the designated upper level ($I_{pk}$) 316 or from another amount. The trigger current ($I_g$) can be conducted at a relatively high slew rate to quickly turn ON the power switch 108. As shown in FIG. 4, the trigger current ($I_g$) can be directly conducted to the terminal 130 of the power switch 108 without being conducted through one or more resistors, inductors, capacitors, switches, or the like.

In one aspect, the timing module 210 can turn off conduction of the trigger current ($I_g$) to the power switch 108 at a shut off time 536. The timing module 210 can turn off conduction of the trigger current ($I_g$) to the power switch 108 from the charging device 206 by closing the third switch 406 (e.g., by increasing the gate voltage $V_{ga}$ up to or above the designated level 526). For example, closing the third switch 406 can cause the trigger current ($I_g$) being discharged from the charging device 206 to be conducted away from the power switch 108. The timing module 210 also can open the second switch 404 at the shut off time 536. The shut off time 536 can represent the time at which the trigger current ($I_g$) is no longer conducted to the power switch 108, even though the power switch 108 may remain ON to conduct electric current from the power supply 102 to the load 104 after the shut off time 536.

The timing module 210 can stop conduction of the trigger current ($I_g$) to the power switch 108 before the charging current ($I_L$) that is stored in the charging device 206 is completely depleted in order to reduce the stress on the power switch 108 that is caused by conduction of both the current from the power supply 102 (shown in FIG. 1) to the load 104 (shown in FIG. 1) and the trigger current ($I_g$). The timing module 210 can close the third switch 406 at the shut off time 536 to allow some or all of the remaining charging current ($I_L$) stored in the charging device 206 to be conducted and/or dissipated by the conductive pathways in the gate driver unit 400 without the trigger current ($I_g$) being conducted to the power switch 108. This remaining dissipation of the charging current ($I_L$) is shown by the continued decrease in the charging current ($I_L$) following the shut off time 536.

Optionally, the charging current ($I_L$) does not fully or completely dissipate from the charging device 206 before the timing module 210 controls the switches to cause the charging device 206 to begin charging again. For example, prior to the charging current ($I_L$) decreasing to zero, the timing module may close the first and third switches 402, 406 and/or open the second switch 404 to begin another charging time period (e.g., similar to the charging time period 528). During this second charging time period, the electric energy stored in the charging device 206 increases above the energy that is still stored in the charging device 206 and not dissipated from the charging device 206.

Figure 6:
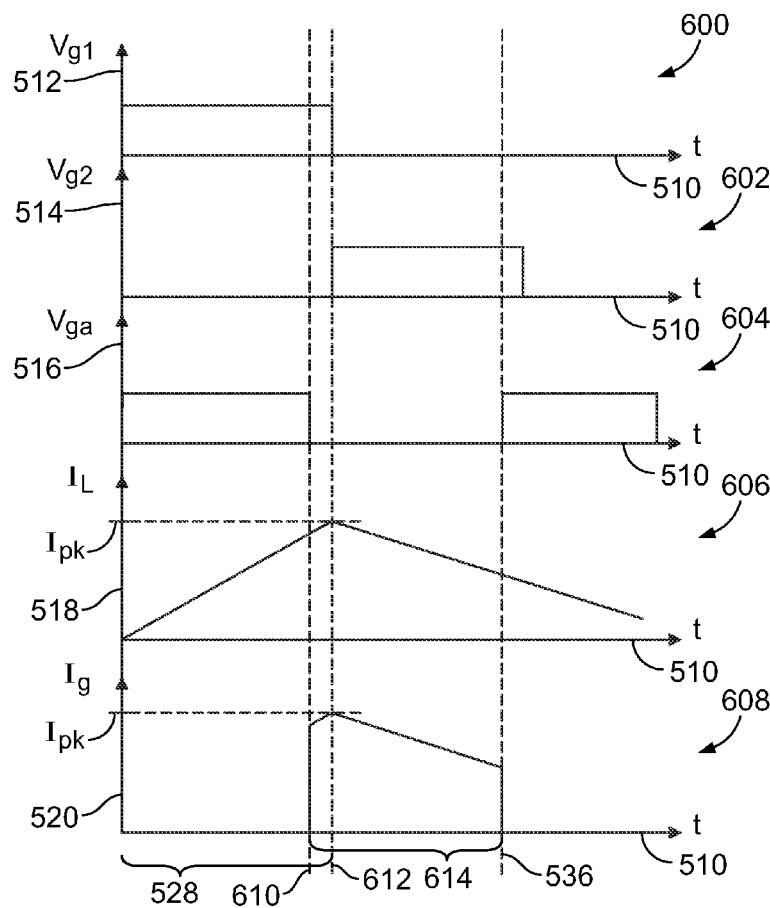
FIG. 6 illustrates timing diagrams for use by the gate drive unit shown in FIG. 4 to control the charging and discharging of the charging device shown in FIG. 4 according to another example of the inventive subject matter described herein.

With continued reference to the circuit diagram shown in FIG. 4, FIG. 6 illustrates timing diagrams 600, 602, 604, 606, 608 for control of charging and discharging the charging device 206 using the gate drive unit 400 according to another example of the inventive subject matter described herein. The timing diagrams 600, 602, 604, 606, 608 are shown alongside the horizontal axes 510 shown in FIG. 5 and the vertical axes 512, 514, 516, 518, 520 also shown in FIG. 5.

In contrast to operation of the gate drive unit 400 according to the timing diagrams shown in FIG. 5, operation of the gate drive unit 400 according to the timing diagrams in FIG. 6 activates discharge of the charging device 206 prior to stopping the conduction of the charging current ($I_L$) to the charging device 206. For example, the timing module 210 closes the first and third switches 402, 406 to initiate conduction of the charging current ($I_L$) to the charging device 206, and keeps the first and third switches 402, 406 closed to charge the charging device 206 during the charging time period 528.

In contrast to the timing diagrams shown in FIG. 5, however, the timing module 210 may open the third switch 406 while keeping the first switch open 402 at an activation time 610 that occurs prior to a termination time 612 of the charging time period 528. For example, the activation time 610 may not represent the end of the charging time period 528, but occurs during the charging time period 528. As a result, the charging current ($I_L$) that is stored in the charging device 206 may not yet have reached the designated upper level ($I_{pk}$) 316 when the activation time 610 occurs.

At the activation time 610, the timing module 210 can open the third switch 406 while keeping the first switch 402 closed to cause the charging current ($I_L$) to begin discharging to the power switch 108 as the trigger current ($I_g$). The first switch 402 may remain closed until the later termination time 612. As a result, the charging current ($I_L$) may continue charging the charging device 206 during the time period extending from the activation time 610 to the termination time 612. Opening the third switch 406 before the first switch 402 can allow the turning ON of the power switch 108 to occur earlier in time relative to the timing diagrams shown in FIG. 5 and before the charging device 206 is charged with the designated upper level ($I_{pk}$) 316 of charging current ($I_L$). The trigger current ($I_g$) can be conducted at a relatively high magnitude to quickly turn ON the power switch 108. The trigger current ($I_g$) can be directly conducted to the terminal 130 of the power switch 108 without being conducted through one or more resistors, inductors, capacitors, switches, or the like.

A discharging time period 614 during which the trigger current ($I_g$) is conducted to the power switch 108 to activate the power switch 108 may begin at the activation time 610 and at least partially overlap (in time) the charging time period 528. During the discharging time period 614, the charging current ($I_L$) is discharged from the charging device 206 as the trigger current ($I_g$), as shown by the decrease in the charging current ($I_L$), as described above. The charging current ($I_L$) and/or the trigger current ($I_g$) may decrease from the designated upper level ($I_{pk}$) 316 or from another amount.

In one aspect, the timing module 210 can turn off conduction of the trigger current ($I_g$) to the power switch 108 at the shut off time 536. As described above, the shut off time 536 can represent the time at which the trigger current ($I_g$) is no longer conducted to the power switch 108, even though the power switch 108 may remain ON to conduct electric current from the power supply 102 to the load 104 after the shut off time 536. The timing module 210 can turn off conduction of the trigger current ($I_g$) to the power switch 108 from the charging device 206 by closing the third switch 406 at the shut off time 536. The timing module 210 may keep the second switch 404 closed for at least a portion of the time following the shut off time 536. The timing module 210 can stop conduction of the trigger current ($I_g$) to the power switch 108 before the charging current ($I_L$) that is stored in the charging device 206 is completely depleted in order to reduce the stress on the power switch 108 that is caused by conduction of both the current from the power supply 102 (shown in FIG. 1) to the load 104 (shown in FIG. 1) and the trigger current ($I_g$).

Similar to as described above in connection with the timing diagrams shown in FIG. 5, the timing module 210 can close the third switch 406 at the shut off time 536 to allow some or all of the remaining charging current ($I_L$) stored in the charging device 206 to be conducted and/or dissipated by the conductive pathways in the gate driver unit 400 without the trigger current ($I_g$) being conducted to the power switch 108. This remaining dissipation of the charging current ($I_L$) is shown by the continued decrease in the charging current ($I_L$) following the shut off time 536.

Figure 7:
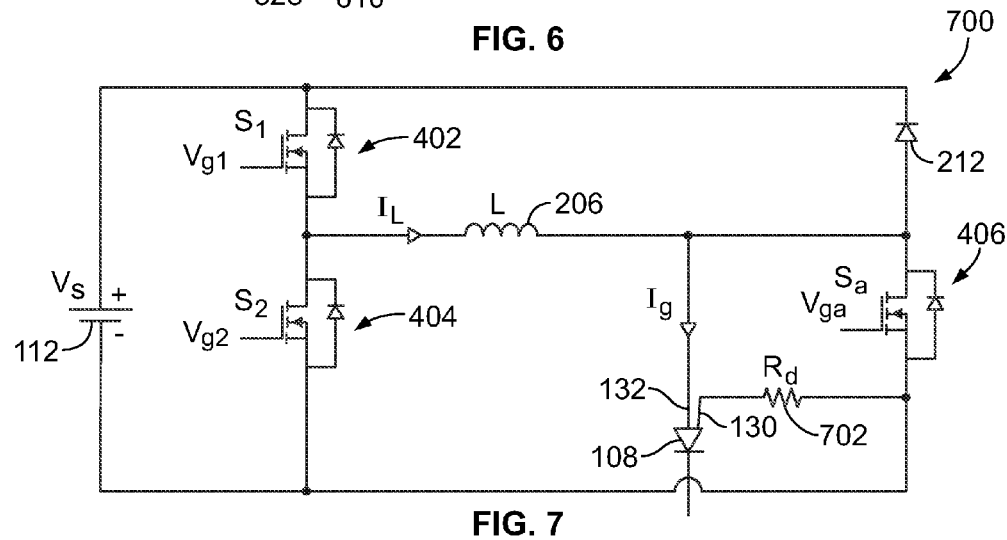
FIG. 7 illustrates another example of a gate drive unit according to another example of the inventive subject matter described herein.

FIG. 7 illustrates another example of a gate drive unit 700 according to another example of the inventive subject matter described herein. The gate drive unit 700 may be used as the gate drive unit 110 shown in FIG. 1. Similar to the gate drive unit 400 shown in FIG. 4, the gate drive unit 700 includes the first, second, and third switches 402, 404, 406 conductively coupled with the charging device 206, the power switch 108, and the energy source 112. The timing module 210 (shown in FIG. 2) may be connected with the switches 402, 404, 406 to control when the switches 402, 404, 406 are open or closed. The gate drive unit 700 optionally may include the diode 212.

One difference between the gate drive unit 700 and the gate drive units 110, 400 shown in FIGS. 1 and 4 is the inclusion of a dampening resistive element 702 in the gate drive unit 700. The resistive element 702 (or $R_d$) can include an electronic component that resists the conduction of electric current, such as a resistor having a resistance of one ohm, 1.5 ohms, two ohms, or another value. In the illustrated example, the resistive element 702 is conductively coupled with the third switch 406 and the gate terminal 132 of the power switch 108 in a location that is between the third switch 408 and the gate terminal 132 of the power switch 108.

Without the resistive element 702, the trigger current ($I_g$) that is conducted out of the charging device 206 to the power switch 108 may cyclically change with respect to type, or oscillate at one or more resonant frequencies. These oscillations can delay the activation of the power switch 108 and/or can generate additional stress on the power switch 108. In order to reduce or eliminate the magnitude of the changes in the trigger current ($I_g$) with respect to time (e.g., in order to reduce the size of the oscillations), the resistive element 702 may be added to the gate drive unit 700. The resistive element 702 can reduce the magnitude of the oscillations in the trigger current ($I_g$) when the gate drive unit 700 is operated according to one or more of the timing diagrams described herein.

Figure 8:
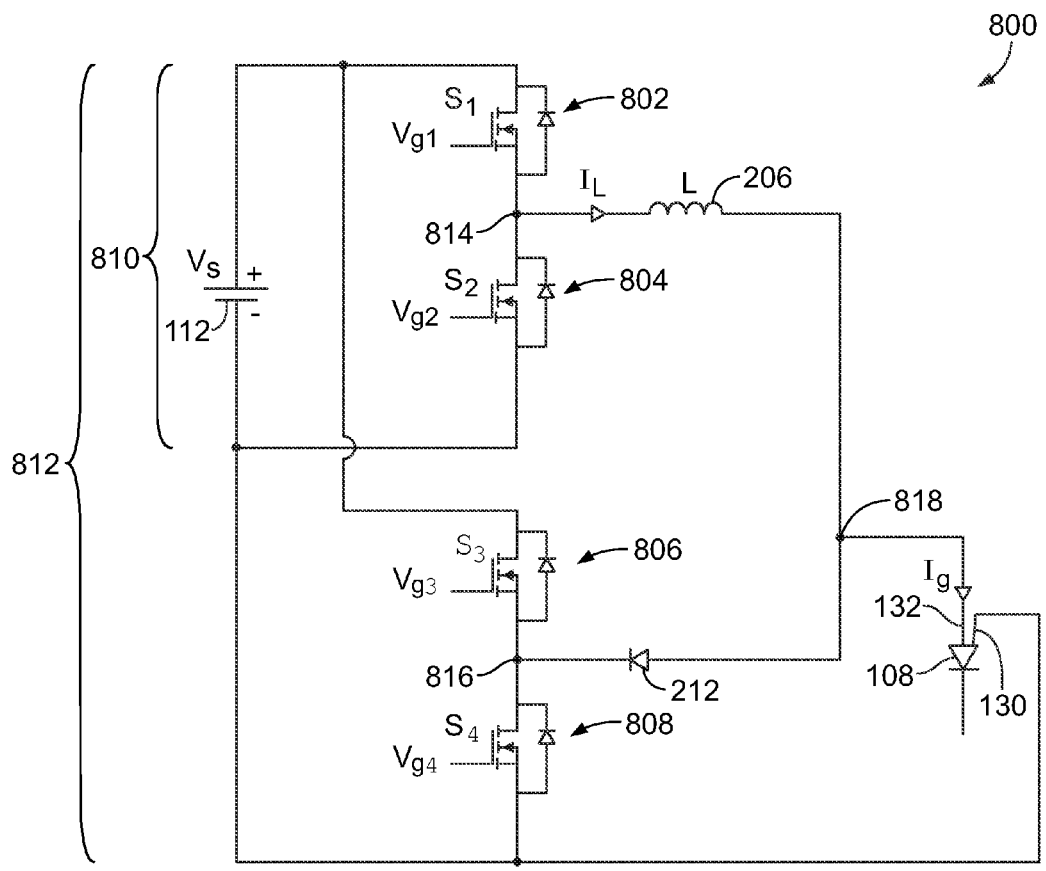
FIG. 8 illustrates another example of a gate drive unit according to another example of the inventive subject matter described herein.

FIG. 8 illustrates another example of a gate drive unit 800 according to another example of the inventive subject matter described herein. The gate drive unit 800 may be used as the gate drive unit 110 shown in FIG. 1. The gate drive unit 800 includes two sets of switches, including a first set comprising a first switch 802 conductively coupled with a second switch 804 in a first circuit loop 810, and a second set comprising a third switch 806 conductively coupled with a fourth switch 808 in a second circuit loop 812. The switches 802, 804, 806, 808 may be similar or identical to the switches described above. The timing module 210 shown in FIG. 2 may be connected with the switches 802, 804, 806, 808 to control opening or closing of the switches 802, 804, 806, 808.

The charging device 206 is conductively coupled with the first circuit loop 810 at a node 814 that is between the first switch 802 and the second switch 804. The charging device 206 also is conductively coupled with the second circuit loop 812 at a node 816 that is between the third switch 806 and the fourth switch 808. The diode 212 may be conductively coupled with the second circuit loop 812 at the node 816 or in another location. The power switch 108 can be conductively coupled with the charging device 206 and the diode 212 and/or the third and fourth switches 806, 808 at a node 818 that is between the charging device 206 and the diode 212 and/or the third and fourth switches 806, 808.

Figure 9:
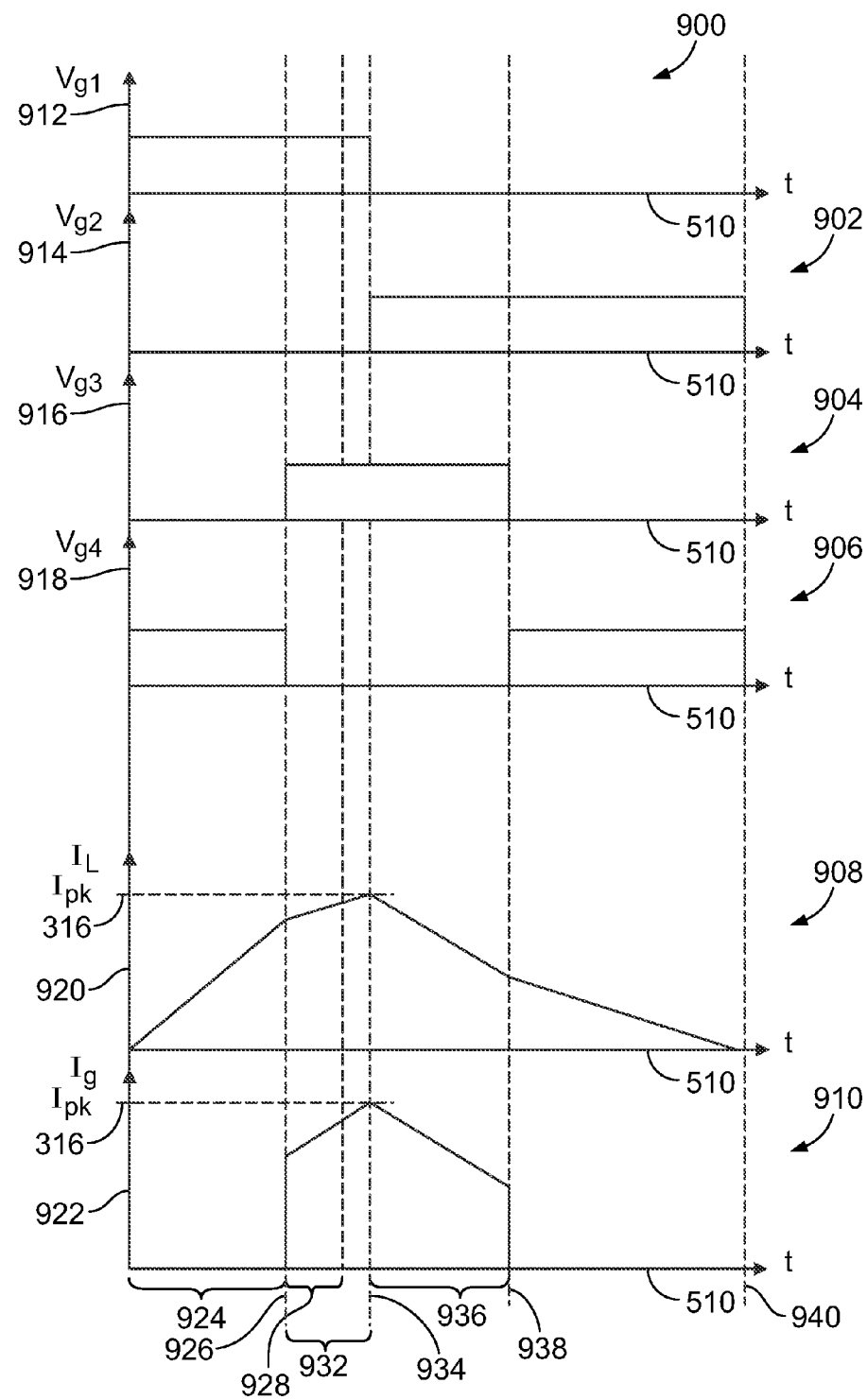
FIG. 9 illustrates timing diagrams of the gate drive unit shown in FIG. 8 to control charging and discharging of the charging device shown in FIG. 8 according to another example of the inventive subject matter described herein.

With continued reference to the gate drive unit 800 shown in FIG. 8, FIG. 9 illustrates timing diagrams 900, 902, 904, 906, 908 for control of charging and discharging the charging device 206 using the gate drive unit 800 according to another example of the inventive subject matter described herein. The timing diagrams 900, 902, 904, 906, 908 are shown alongside the horizontal axes 510 shown in FIG. 5 and vertical axes 912, 914, 916, 918, 920. The vertical axes 912, 914, 916, 918 represent the magnitude of voltage or current applied to gate terminals of the first, second, third, and fourth switches 802, 804, 806, 808, respectively, similar to the vertical axes 512, 514, 516 shown in FIG. 5.

The switches 802, 804, 806, 808 in each set can be complementary to each other, such as the switches 802, 804 being complementary to each other and the switches 806, 808 being complementary to each other. For example, in one embodiment, the first switch 802 may only be closed while the second switch 804 is opened, the first switch 802 may only be opened while the second switch 804 is closed, the second switch 804 may only be closed while the first switch 802 is opened, and the second switch 804 may only be opened while the first switch 804 is closed. Similarly, in one embodiment, the third switch 806 may only be closed while the fourth switch 808 is opened, the third switch 806 may only be opened while the fourth switch 808 is closed, the fourth switch 808 may only be closed while the third switch 806 is opened, and the fourth switch 808 may only be opened while the third switch 806 is closed. Alternatively, other relationships between when the switches in each set are opened or closed may be used.

During a first charging time period 924, the first and fourth switches 802, 808 may be closed while the second and third switches 804, 806 are open. This causes conduction of the charging current ($I_L$) to the charging device 206. At a subsequent time 926, the third switch 806 may be closed and the fourth switch 808 opened. As shown in FIG. 9, this can cause the rate at which the charging current is conducted to and/or stored in the charging device 206 to decrease.

At an activation time 930, the charging current ($I_L$) that is stored in the charging device 206 may be at or close to the designated upper level 316. This level 316 of stored current may be sufficiently large to activate the power switch 108. As a result, at least some of the stored charging current ($I_L$) begins to be discharged to the gate terminal 132 of the power switch 108 as the trigger current ($I_g$). This trigger current ($I_g$) may be directly conducted to the gate terminal 132 without being conducted through other resistors, capacitors, inductors, or the like. Because at least some of the charging current ($I_L$) is still being conducted to the charging device 206, the charging device 206 may continue to be charged with the charging current ($I_L$), as shown during a charging and discharging time period 932. The charging and discharging time period 932 represents a time period when the charging device 206 continues to be charged while also discharging at least some of the trigger current.

At a charging termination time 934, the timing module 210 opens the first switch 802 and may close the second switch 804. As a result, the charging current ($I_L$) from the energy source 112 can be conducted or circulated through the gate terminal 132 of the power switch 108 and the second switch 804, and the current stored in the charging device 206 can be discharged as the trigger current ($I_g$) out of the gate terminal 132 of the power switch 108 during a first discharging time period 936. The trigger current ($I_g$) can be conducted at a relatively high slew rate to quickly turn ON the power switch 108. As shown in FIG. 8, the trigger current ($I_g$) can be directly conducted out of the gate terminal 132 of the power switch 108 without being conducted through one or more resistors, inductors, capacitors, switches, or the like.

At a shut off time 938, the timing module 210 can and close the fourth switch 808 and keep the second switch 804 closed to stop conduction of the trigger current ($I_g$) to the anode terminal 130 of the power switch 108. The timing module 210 also may open the third switch 806. The trigger current ($I_g$) can be stopped from being conducted to the anode terminal 130 to prevent stressing or damaging the power switch 108. The remaining charged energy in the charging device 206 may then be conducted out of the charging device 206, as shown in the timing diagram 910 in FIG. 9.

Figure 10:
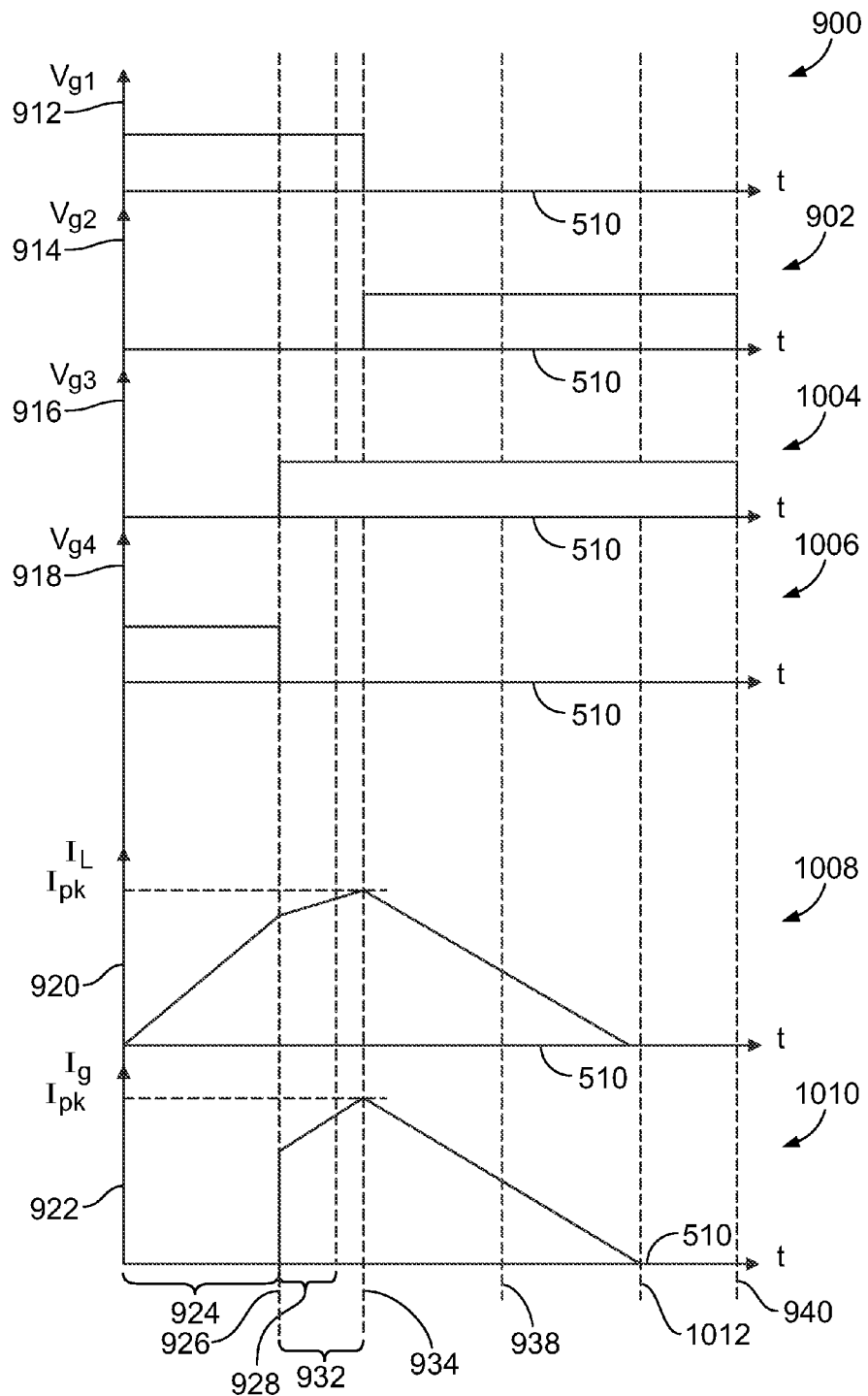
FIG. 10 illustrates timing diagrams of the gate drive unit shown in FIG. 8 to control charging or discharging of the charging device shown in FIG. 8 in accordance with another example of the inventive subject matter described herein.

With continued reference to the gate drive unit 800 shown in FIG. 8, FIG. 10 illustrates the timing diagrams 900, 902 and timing diagrams 1004, 1006, 1008, 1010 for use by the gate drive unit 800 in accordance with another example of the inventive subject matter described herein. In this example, the first and second switches 800, 802 may be opened or closed according to the same timing diagrams 900, 902 described above in FIG. 9.

The third switch 806 and/or the fourth switch 808, however, may be operated differently. For example, the third switch 806 may be closed at the time 926 to reduce the rate at which the charging current is conducted to and/or stored in the charging device 206. The third switch 806 may remain closed while the fourth switch 808 is opened at the time 926 and may not be closed thereafter.

Keeping the third switch 806 closed and/or keeping the fourth switch 808 open as shown in the timing diagrams 1004, 1006 in FIG. 10 can cause the charging current ($I_L$) and the trigger current ($I_g$) to be discharged more rapidly than the timing diagrams 904, 906 shown in FIG. 9. When the third and fourth switches 806, 808 are operated according to the timing diagrams 904, 906 in FIG. 9, the trigger current ($I_g$) is not permitted to fully discharge from the charging device 206 and, as a result, the charging current ($I_L$) more slowly dissipates to zero at a discharge time 940. This can result in additional stress to the power switch 108. But, by leaving the third switch 806 closed and/or the fourth switch 808 open as shown in the timing diagrams 1004, 1006, both the trigger current ($I_g$) and the charging current ($I_L$) are permitted to discharge to zero. As a result, the trigger current ($I_g$) and the charging current ($I_L$) may discharge to zero at an earlier discharge time 1012 shown in FIG. 10. This can cause less stress to be imparted on the power switch 108.

Figure 11:
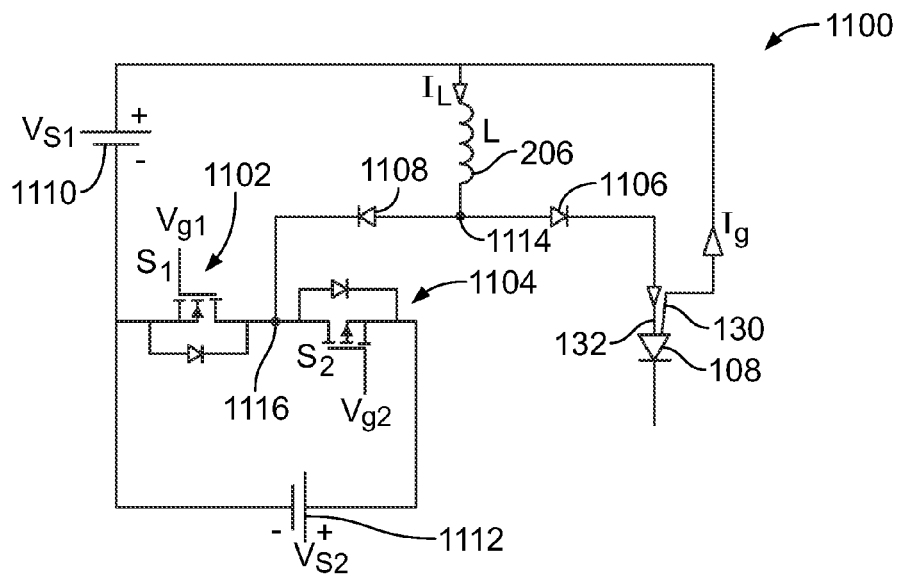
FIG. 11 is a circuit diagram of another gate drive unit according to another example of the inventive subject matter described herein.

FIG. 11 is a circuit diagram of another gate drive unit 1100 according to another example of the inventive subject matter described herein. The gate drive unit 1100 may be used in place of the gate drive unit 110 shown in FIG. 1. The gate drive unit 1100 includes the charging device 206, which is conductively coupled with a first energy source 1110. The first energy source 1110 may be similar or identical to the energy source 112 (shown in FIG. 1). The charging device 206 is conductively coupled with opposing freewheeling diodes 1106, 1108. The diodes 1106, 1108 may be referred to as opposing diodes 1106, 1108 because the diodes 1106, 1108 permit conduction of current in opposite directions in the gate drive unit 1100. The charging device 206 is conductively coupled with the freewheeling diodes 1106, 1108 at a node 1114 that is between the freewheeling diodes 1106, 1108.

The freewheeling diode 1106 may be referred to as a gate activation diode 1106 because the trigger current ($I_g$) that is discharged from the charging device 206 is conducted through the freewheeling diode 1106 to the gate terminal 132 of the power switch 108. The freewheeling diode 1108 may be referred to as a charging diode 1108 because the charging current ($I_L$) may be at least partially conducted through the diode 1108 during charging of the charging device 206.

The gate drive unit 1100 includes first and second switches 1102, 1104 conductively coupled with each other and with the freewheeling diode 1108. The freewheeling diode 1108 can be conductively coupled with the switches 1102, 1104 at a node 1116 that is between the first and second switches 1102, 1104. The switches 1102, 1104 may be similar or identical to one or more of the switches 208, 402, 404, 406, 802, 804, 806, 808 (shown in FIGS. 2, 4, and 8). Alternatively, another type of switch may be used.

A second energy source 1112 is conductively coupled with the first and second switches 1102, 1104 and with the first energy source 1110. The first and second energy sources 1110, 1112 may be the same or different types of sources of electric energy (e.g., voltage or current). For example, the energy sources 1110, 1112 may provide voltage or current to charge the charging device 206 with the charging current ($I_L$), to control opening or closing of the switches 1102, 1104, or the like.

Figure 12:
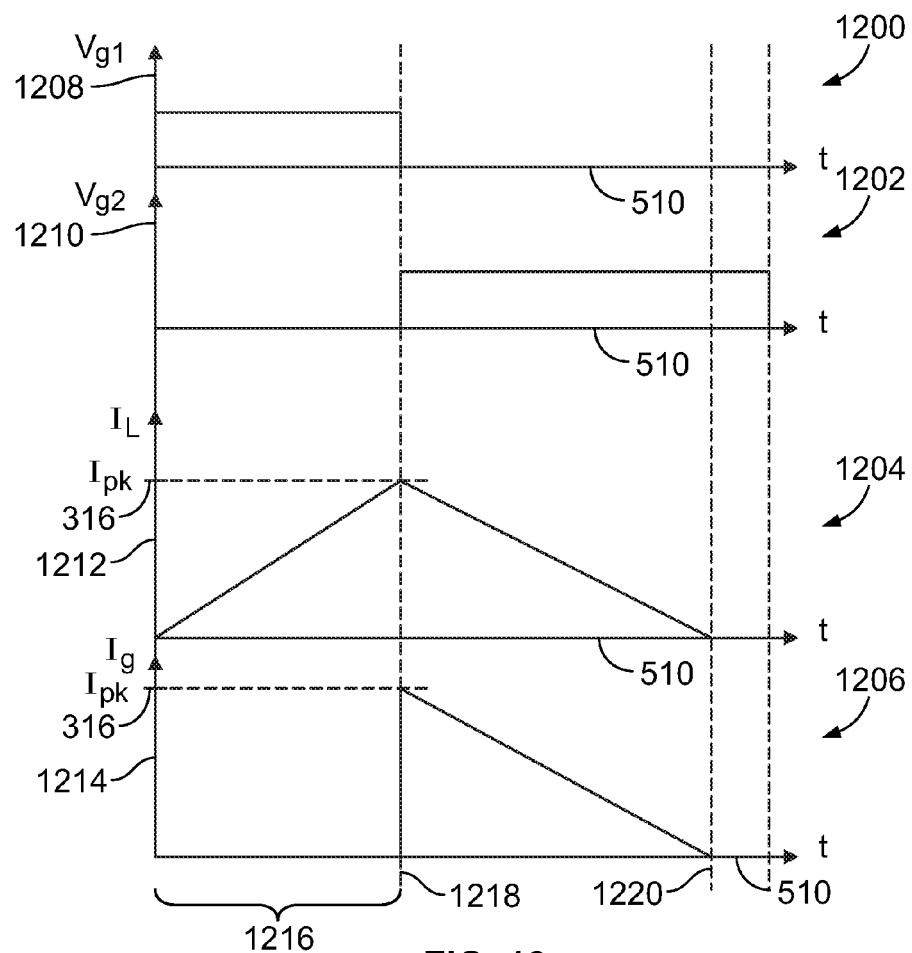
FIG. 12 illustrates timing diagrams of the gate drive unit shown in FIG. 11 to control charging or discharging of the charging device shown in FIG. 11 according to another example of the inventive subject matter described herein.

With continued reference to the gate drive unit 1100 shown in FIG. 11, FIG. 12 illustrates timing diagrams 1200, 1202, 1204, 1206 that can be used to control the switches 1102, 1104 in the gate drive unit 1100 according to one example of the inventive subject matter described herein. The timing diagrams 1200, 1202, 1204, 1206 are shown alongside the horizontal axes 510 representative of time. The timing diagram 1200 represents gate voltages ($V_{g1}$) that are applied to a gate terminal of the first switch 1102 to open or close the switch 1102. A vertical axis 1208 of the timing diagram 1200 represents the magnitudes of the gate voltages ($V_{g1}$). The timing diagram 1202 represents gate voltages ($V_{g2}$) that are applied to a gate terminal of the second switch 1104 to open or close the switch 1104. A vertical axis 1210 of the timing diagram 1200 represents the magnitudes of the gate voltages ($V_{g2}$). The timing diagram 1204 represents the charging current ($I_L$) that is conducted to the charging device 206 to charge the charging device 206 and includes a vertical axis 1212 representative of magnitudes of the charging current ($I_L$). The timing diagram 1206 represents the trigger current ($I_g$) that is conducted from the charging device 206 to the anode terminal 130 of the power switch 108 to activate the power switch 108. The timing diagram 1206 includes a vertical axis 1214 representative of magnitudes of the trigger current ($I_g$).

As shown in FIG. 12, operation of the first and second switches 1102, 1104 can be complementary. For example, the first and second switches 1102, 1104 can be opened or closed so that both switches 1102, 1104 are not both open at the same time and are not both closed at the same time. The first switch 1102 can be turned on (e.g., closed) for a charging time period 1216. During this time period 1216, the second switch 1104 is off (e.g., open) so that the charging current ($I_L$) can charge the charging device 206 to the designated upper level 316.

At an activation time 1218, the timing module 210 opens the first switch 1102 and can close the second switch 1104. As a result, the charging current ($I_L$) that is stored in the charging device 206 is discharged as the trigger current ($I_g$). The trigger current ($I_g$) may be conducted through the diode 1106 to the anode terminal 130 of the power switch 108 to activate the power switch 108. Similar to as described above, the slew rate of the trigger current ($I_g$) can be relatively large to quickly turn ON the power switch 108. The trigger current ($I_g$) may be conducted directly to the anode terminal 130 from the charging device 206 without being conducted through one or more resistors, capacitors, inductors, or the like. The energy stored in the charging device 206 and the trigger current ($I_g$) can gradually dissipate to zero or relatively little energy (e.g., at a time 1220). During discharge of the charging current ($I_L$) from the charging device 206 as the trigger current ($I_g$), the diode 1108 can clamp the voltage applied to the anode terminal 130 to the voltage provided by the second energy source 1112.

Figure 13:
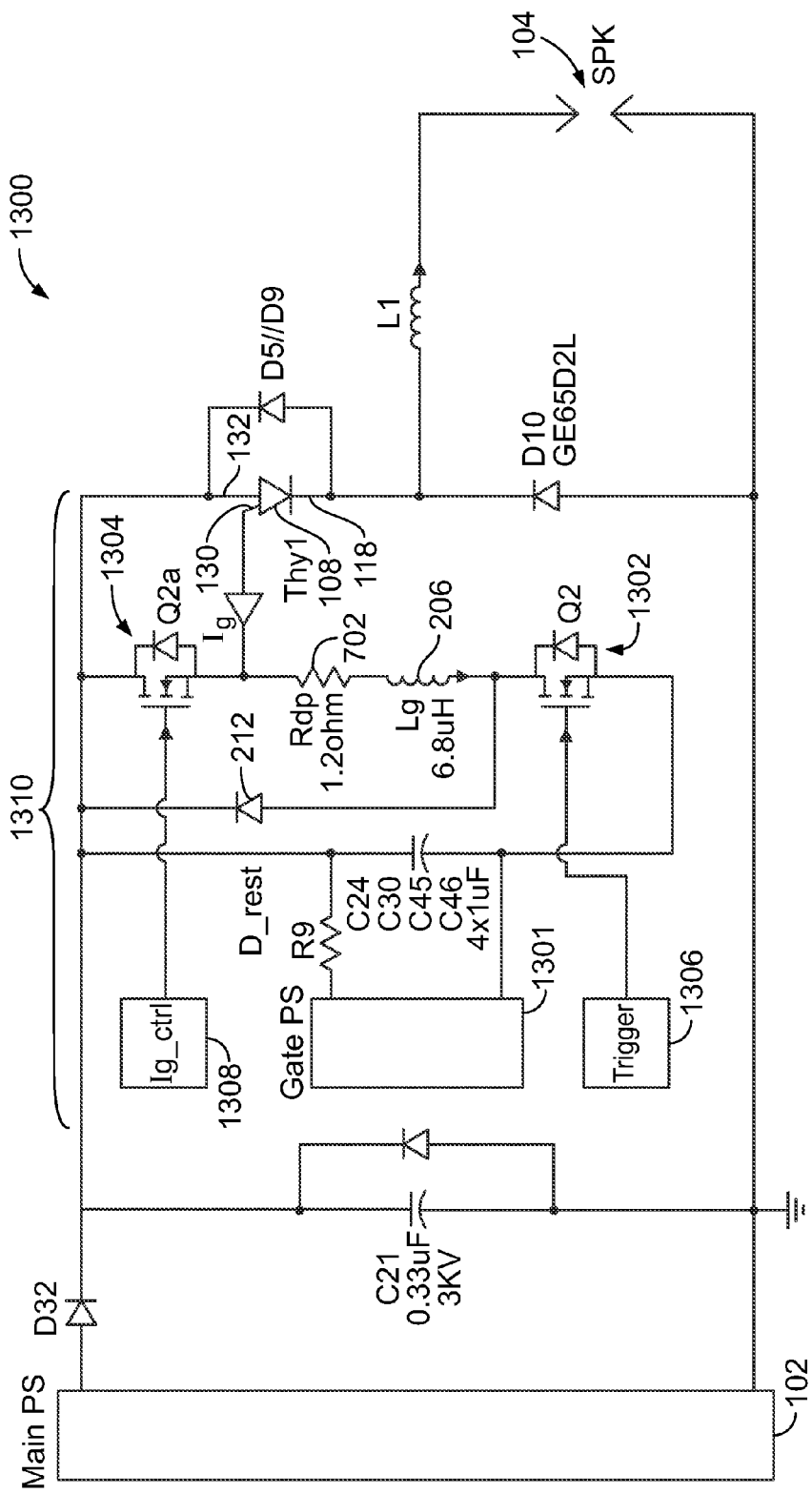
FIG. 13 is a circuit diagram of a power supply circuit according to another example of the inventive subject matter described herein.

FIG. 13 is a circuit diagram of a power supply circuit 1300 according to another example of the inventive subject matter described herein. The power supply circuit 1300 may be similar to the power supply circuit 100 shown in FIG. 1 in that the power supply circuit 1300 includes the power source 102 that supplies current (e.g., a load current) to the load 104 via the power switch 108. A gate drive unit 1310 controls activation of the power switch 108, similar to the other gate drive units described herein.

The gate drive unit 1310 includes first and second switches 1302, 1304 that are conductively coupled with each other and with the power source 1301. The first and second switches 1302, 1304 may be similar to one or more of the switches 208, 402, 404, 406, 802, 804, 806, 808, 1102, 1104 shown in FIGS. 2, 4, 8, and 11. The charging device 206 is conductively coupled with the first and second switches 1302, 1304 in a location that is between the first and second switches 1302, 1304. The dampening resistive element 702 optionally may be conductively coupled with the first switch 1302 and the charging device 206 in a location that is between the first switch 1302 and the charging device 206. As described above, the resistive element 702 can reduce the magnitude of oscillations in the trigger current ($I_g$) that is discharged from the charging device 206 to the gate terminal 132 of the power switch 108.

The gate drive unit 1310 includes and/or is coupled with first and second timing modules 1306, 1308. Similar to the timing module 210 shown in FIG. 1, the first and second timing modules 1306, 1308 can control when the first and second switches 1302, 1304, respectively, are closed (e.g., turned ON) or opened (e.g., turned OFF). The first and second timing modules 1306, 1308 optionally may be combined into a single timing module. The timing modules 1306, 1308 may include energy sources, such as the energy source 112 shown in FIG. 1, that supplies the gate voltages applied to gate terminals of the switches 1302, 1304 to control when the switches 1302, 1304 are closed or open. Optionally, the timing modules 1306, 1308 may be connected to the same energy source, such as the energy source 112, to control supply of the gate voltages to the switches 1302, 1304.

Figure 14:
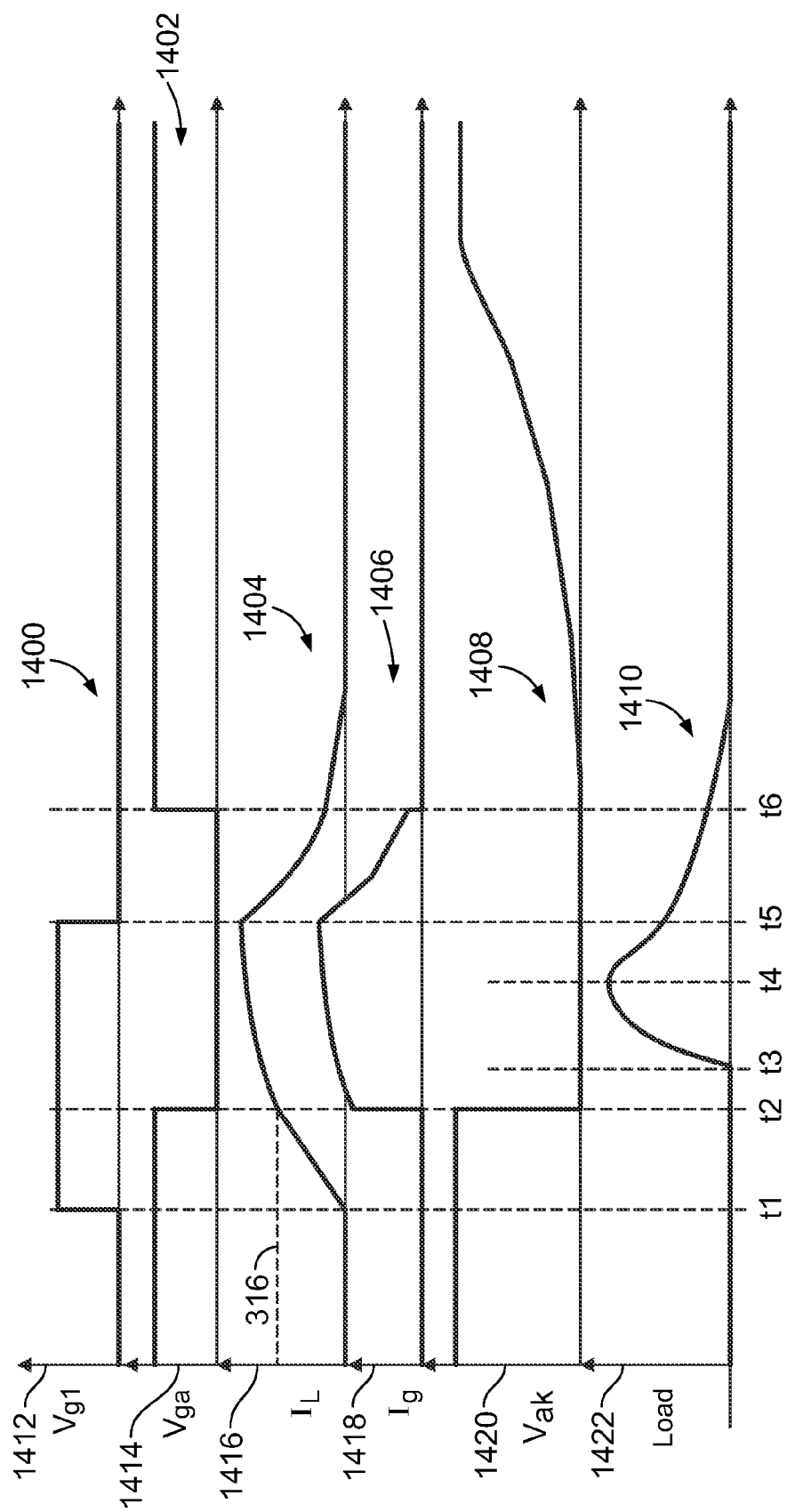
FIG. 14 illustrates timing diagrams of the gate drive unit shown in FIG. 13 in controlling charging or discharging of the charging device shown in FIG. 13 in accordance with another example of the inventive subject matter described herein.

With continued reference to the gate drive unit 1310 shown in FIG. 13, FIG. 14 illustrates timing diagrams 1400, 1402, 1404, 1406, 1408, 1410 for use by the gate drive unit 1310 in controlling operation of the power switch 108 in accordance with another example of the inventive subject matter described herein. The timing diagrams 1400, 1402, 1404, 1406, 1408, 1410 are shown alongside the horizontal axes 510 representative of time.

The timing diagram 1400 represents the electric energy (e.g., gate voltage $V_{g1}$) that is supplied to the first switch 1302 to control opening or closing of the first switch 1302. The timing diagram 1400 is shown alongside a vertical axis 1412 representative of magnitudes of the gate voltage ($V_{g1}$).

The timing diagram 1402 represents the electric energy (e.g., gate voltage $V_{ga}$) that is supplied to the second switch 1304 to control opening or closing of the second switch 1304. The timing diagram 1402 is shown alongside a vertical axis 1414 representative of magnitudes of the gate voltage ($V_{ga}$).

The timing diagram 1404 represents the charging current ($I_L$) that is conducted to and stored in the charging device 206. The timing diagram 1404 is shown alongside a vertical axis 1416 representative of magnitudes of the charging current ($I_L$). The timing diagram 1406 represents the trigger current ($I_g$) that is discharged from the charging device 206 and conducted to the power switch 108 to activate the power switch 108. The timing diagram 1406 is shown alongside a vertical axis 1418 representative of magnitudes of the trigger current ($I_g$).

The timing diagram 1408 represents the voltage drop ($V_{ak}$) across the power switch 108 (e.g., between the anode and cathode terminals 132, 118 of the power switch 108). The timing diagram 1408 is shown alongside a vertical axis 1420 representative of magnitudes of the voltage drop ($V_{ak}$). The timing diagram 1410 represents the current load ($I_{load}$) that is conducted through the power switch 108 from the power supply 102 to the load 104. The timing diagram 1410 is shown alongside a vertical axis 1422 representative of magnitudes of the current load ($I_{load}$).

In operation, the timing module 1308 can apply a sufficiently large gate voltage ($V_{ga}$) to the second switch 1304 to cause the second switch 1304 to be activated (e.g., closed). At a charging time ($t_1$), the timing module 1306 ($V_{g1}$) can apply a sufficiently large gate voltage to cause the first switch 1302 to be activated (e.g., closed). Once the first and second switches 1302, 1304 are activated, the charging current ($I_L$) begins conducting to the charging device 206 and charging the charging device 206, as shown in the timing diagram 1404 by the increase in the charging current ($I_L$) that is stored in the charging device 206 following the charging time ($t_1$). The stored charging current ($I_L$) may continue to increase until the stored charging current ($I_L$) reaches the designated upper level 316, such as at or near an activation time ($t_2$).

At or near the activation time ($t_2$), the second timing module 1308 can turn off (e.g., open) the second switch 1304, as shown in the timing diagram 1402. The first switch 1302 may remain closed, as shown in the timing diagram 1400. The charging current ($I_L$) stored in the charging device 206 can then be discharged from the charging device 206 to the gate terminal 130 of the power switch 108 as the trigger current ($I_g$). As shown in the timing diagrams 1404, 1406, the charging current ($I_L$) that is stored in the charging device 206 and the trigger current ($I_g$) that is discharged from the charging device 206 to the gate terminal 130 of the power switch 108 can continue to increase from the activation time ($t_2$) to a shut off time ($t_5$).

The trigger current ($I_g$) may have a sufficiently large slew rate and/or magnitude at an ON time ($t_2$) to cause the power switch 108 to be activated and begin conducting the load current ($I_{load}$) from the power supply 102 to the load 104. As shown in the timing diagram 1410, the load current ($I_{load}$) increases following the ON time ($t_2$) with a delay time ($t_3$–$t_2$) due to breakdown delay of a spark plug.

The trigger current ($I_g$) can keep increasing when the power switch 108 is activated. The trigger current ($I_g$) can continue increasing with a reduced rate to support the power switch 108 carrying the load current ($I_{load}$) with a relatively low voltage drop ($V_{ak}$) when the power switch 108 is activated. The load current load current ($I_{load}$) may peak at a time ($t_4$) and then begin decreasing, as shown in the timing diagram 1410. At a later time ($t_5$), the timing module 1306 can open the first switch 1302, as shown by the decrease in the gate voltage ($V_{g1}$) in the timing diagram 1400. The charging current ($I_L$) stored in the charging device 206 and the trigger current ($I_g$) can then decrease, as shown in the timing diagrams 1404, 1406. The timing module 1308 can close the second switch 1304 at a later time ($t_6$) to shunt the trigger current ($I_g$) (e.g., decrease the trigger current to zero). The stored charging current ($I_L$) continues to dissipate, thereby reducing the stress on the power switch 108.

Figure 15:
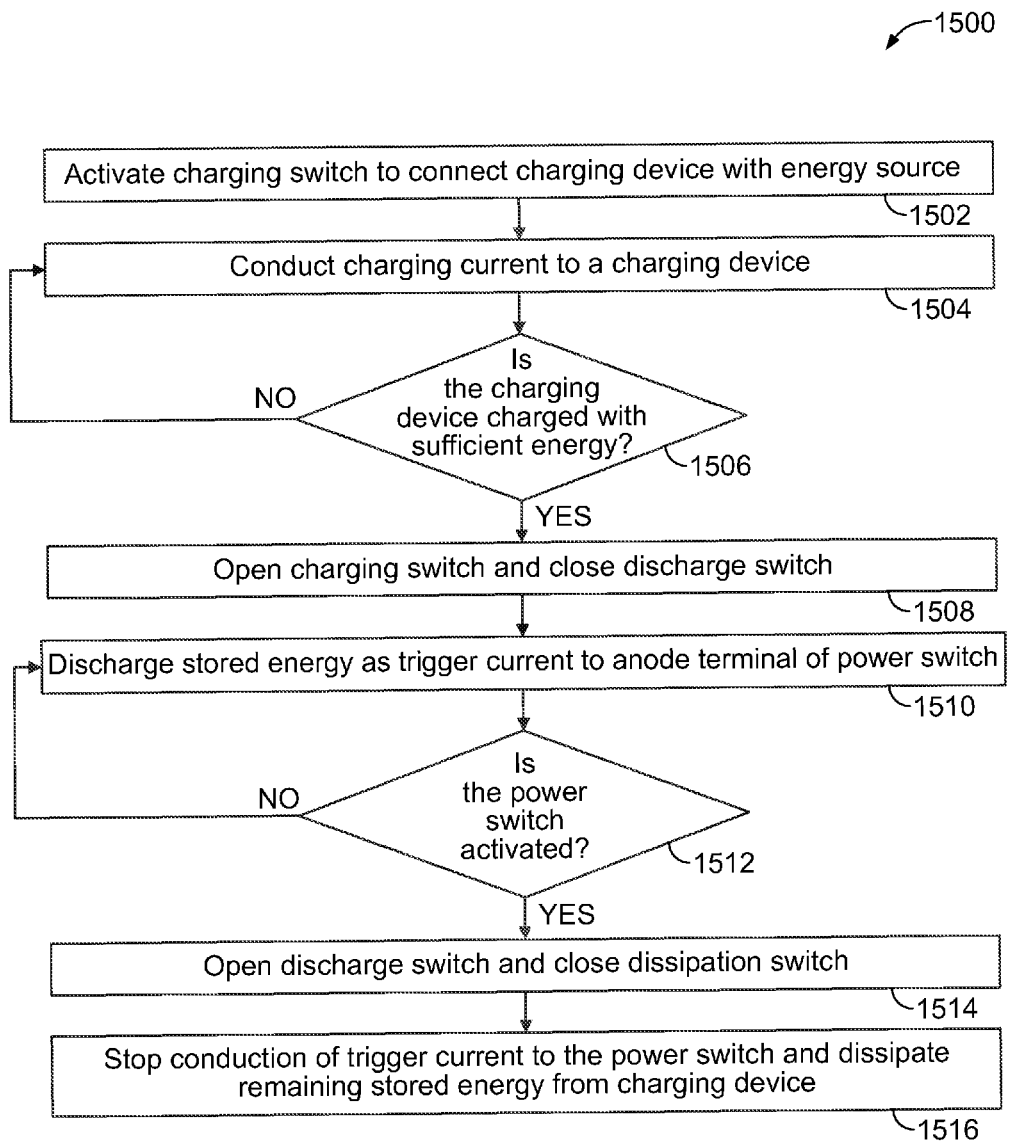
FIG. 15 illustrates a flowchart of a method for controlling a gate drive unit to activate a power switch according to one example of the inventive subject matter described herein.

FIG. 15 illustrates a flowchart of a method 1500 for controlling a gate drive unit to activate a power switch according to one example of the inventive subject matter described herein. The method 1500 may be performed by one or more of the gate drive units described herein to generate a trigger current with a sufficiently large slew rate that optionally may be directly conducted to a gate terminal of a power switch to quickly activate a power switch. The method 1500 also may be performed by one or more of these gate drive units to cut off the conduction of the trigger current to the power switch and/or to allow safe dissipation of stored current in a charging device to avoid overly stressing or damaging the power switch.

At 1502, a charging switch of the gate drive unit is activated (e.g., closed) to connect a charging device with an energy source. For example, with respect to the gate drive unit 110 shown in FIG. 2, the switch 208 may be closed to connect the charging device 206 with the energy source 112. With respect to the gate drive unit 400 shown in FIG. 4, the first switch 402 may be closed to connect the charging device 206 with the energy source 112. Optionally, the second switch 404 in FIG. 4 may be kept deactivated, or open, to prevent conduction of current from the charging device 206 to the gate terminal 132 of the power switch 108.

With respect to the gate drive unit 800 shown in FIG. 8, the first switch 802 may be closed to connect the charging device 206 with the energy source 112. Optionally, the second switch 804 in FIG. 8 may be kept open to prevent conduction of current from the charging device 206 to the gate terminal 130 of the power switch 108. With respect to the gate drive unit 1100 shown in FIG. 11, the first switch 1102 may be closed to connect the charging device 206 with the energy source 1110. Optionally, the second switch 1104 in FIG. 11 may be kept open to prevent conduction of current from the charging device 206 to the gate terminal 132 of the power switch 108.

With respect to the gate drive unit 1300 shown in FIG. 13, the first switch 1302 may be closed to connect the charging device 206 with an energy source that may be included in or otherwise represented by one or more of the timing modules 1306, 1308. Optionally, the second switch 1304 in FIG. 13 may be closed to conduct current to the charging device 206.

At 1504, charging current is conducted from an energy source to a charging device. For example, one or more energy sources may conduct charging current through the closed charging switch to the charging device in order to increase the energy stored in the charging device. As described above, one or more other switches may be kept open to prevent conduction of current to the gate terminal of the power switch 108.

At 1506, a determination is made as to whether the charging device is charged with a sufficiently large magnitude of charging current to activate the power switch. For example, the rate at which the charging device is charged by the charging current may be calculated or estimated, and the time period during which the charging switch has been closed may be used to calculate or estimate the amount of electric energy (e.g., charging current) stored in the charging device. Optionally, the amount of electric energy (e.g., charging current) stored in the charging device may be measured, such as with one or more ammeters or sensors.

If sufficient energy is stored to activate the power switch, then flow of the method 1500 can proceed to 1508. Otherwise, flow of the method 1500 can return to 1504 so that additional charging current can be conducted to and stored in the charging device.

At 1508, the charging switch is opened and/or one or more discharge switches can be closed at the same time or at different times. The charging switch can be opened to prevent additional current from conducting to and being stored in the charging device. For example, with respect to the gate drive unit 110 shown in FIG. 2, the switch 208 may be opened to disconnect the charging device 206 with the energy source 112. With respect to the gate drive unit 400 shown in FIG. 4, the first switch 402 may be opened to disconnect the charging device 206 with the energy source 112. The second switch 404 can be closed to connect the charging device 206 with the gate terminal 132 of the power switch 108. Optionally, the third switch 406 in FIG. 4 may be deactivated, or opened.

With respect to the gate drive unit 800 shown in FIG. 8, the first switch 802 and/or the fourth switch 808 may be opened to disconnect the charging device 206 with the energy source 112. Optionally, the second switch 804 and/or the third switch 806 in FIG. 8 may be closed conduct current from the charging device 206 to the gate terminal 132 of the power switch 108. With respect to the gate drive unit 1100 shown in FIG. 11, the first switch 1102 may be opened to disconnect the charging device 206 with the energy source 1110. Optionally, the second switch 1104 in FIG. 11 may be closed to conduct current from the charging device 206 to the gate terminal 132 of the power switch 108.

With respect to the gate drive unit 1300 shown in FIG. 13, the first switch 1302 may be kept closed while the second switch 1304 is opened to discharge stored energy in the charging device 206 to the gate terminal 132 of the power switch 108.

At 1510, the energy stored in the charging device is discharged as a trigger current. This trigger current may be directly conducted to the gate terminal of the power switch to quickly activate the power switch. As described above, the trigger current may have a sufficiently large slew rate to quickly turn on the power switch. Additionally, the trigger current may be directly conducted to the gate terminal of the power switch when the trigger current is not conducted through any resistive components, such as components having a resistance that is greater than the intrinsic resistance of the conductive pathways of the gate drive unit. In one aspect, the method 1500 may terminate following 1510 with no further switches in the gate drive unit being opened or closed. Optionally, the method 1500 may proceed as described below.

At 1512, a determination is made as to whether the power switch has been activated by the discharging trigger current. If the trigger current has discharged from the charging device for at least a designated time period (e.g., a time period that is calculated or estimated to convey sufficient energy into the gate of the power switch to activate the power switch), then the power switch may be activated. Optionally, the initiation of conduction from the power supply to the load via the power switch may indicate that the power switch has been activated. If the power switch has been activated, then flow of the method 1500 can proceed to 1514. Otherwise, additional trigger current may need to be conducted to the gate terminal of the power switch to activate the power switch. As a result, flow of the method 1500 may return to 1510.

At 1514, the discharge switch of the gate drive unit may be opened and one or more dissipation switches may be closed. For example, with respect to the gate drive unit 400 shown in FIG. 4, the second switch 404 can be opened to disconnect the charging device 206 with the gate terminal 130 of the power switch 108 and the third switch 406 may be closed. With respect to the gate drive unit 800 shown in FIG. 8, the third switch 806 may be opened and the fourth switch 808 may be closed. Optionally, the second switch 804 may remain closed. With respect to the gate drive unit 1300 shown in FIG. 13, the first switch 1302 may be opened. The second switch 1304 optionally may be closed at the same or a later time.

At 1516, conduction of the trigger current from the charging device to the gate terminal of the power switch is reduced or stopped, and at least some or all of the remaining energy stored in the charging device can be dissipated from the charging device. For example, this stored energy can be conducted out of the charging device without being conducted to the gate terminal of the power switch.

In accordance with one or more examples of the gate drive unit shown and described herein, the rates of change in the trigger current ($I_g$) can be relatively large when compared to other gate drive units and/or the control of the components in the gate drive units according to other timing scenarios not set forth herein. For example, by applying one or more of the timing diagrams for control of the switches in the gate drive units described herein, a charging device 206 with an inductance value of 230 microhenries (µH), and the use of designated upper level 316 of the current that is stored in the charging device of eleven amps, the trigger current ($I_g$) may be conducted out of the charging device 206 to the power switch 108 to activate the power switch 108 at a rate of 230 amps per microsecond. Optionally, other inductance values, designated upper levels of stored current, and/or rates of change in the trigger current may be used.

In another example of the inventive subject matter described herein, a gate drive unit includes a charging device, a first switch, and one or more timing modules. The charging device is conductively coupled with an electric energy source and a power switch between the electric energy source. The power switch configured to be switched between an ON state and an OFF state to control conduction of electric current from a power supply to a load. The charging device is configured to store electric energy supplied by the electric energy source when the electric energy is conducted to the charging device. The first switch is conductively coupled with the electric energy source and the charging device between the electric energy source and the charging device. The first switch is configured to close to conduct the electric energy from the electric energy source to the charging device. The first switch also is configured to open to prevent conduction of the electric energy from the electric energy source to the charging device. The one or more timing modules are coupled with the first switch and configured to control closing or opening of the first switch. The one or more timing modules are configured to close the first switch to direct the electric energy from the electric energy source to the charging device for a designated charging time period in order to charge the charging device with the electric energy while the power switch is in the OFF state. The one or more timing modules also configured to open the first switch to cause the electric energy stored in the charging device to be conducted out of the charging device as a trigger current that is conducted to a gate terminal of the power switch to activate the power switch to the ON state from the OFF state.

In one aspect, the gate drive unit also includes a freewheeling diode conductively coupled with the charging device. The freewheeling diode is configured to conduct the trigger current from the charging device but prevent the electric energy from the energy source from being conducted into the gate terminal of the power switch.

In one aspect, the one or more timing modules are configured to open the first switch to initiate conduction of the trigger current from the charging device to switch the power switch to the ON state and to stop charging of the charging device with the electric energy from the electric energy source.

In one aspect, the power switch is an N-P-N-P semiconductor device formed from a substrate n-doped layer that is coupled with a cathode terminal of the power switch, a blocking p-doped layer that is coupled with the substrate n-doped layer, a gate n-doped layer that is coupled with the gate terminal and with the blocking p-doped layer such that the blocking p-doped layer is between the gate n-doped layer and the substrate n-doped layer, and an anode p-doped layer that is coupled with the gate n-doped layer and the anode terminal of the power switch.

In one aspect, the power switch is an asymmetric switching device that blocks conduction of electric current from the cathode terminal to the anode terminal through the substrate n-doped layer, the blocking p-doped layer, the gate n-doped layer, and the anode p-doped layer.

In one aspect, the gate drive unit also includes a second switch conductively coupled with the energy source and the charging device between the energy source and the charging device. The charging device can be conductively coupled with the first and second switches in a location that is between the first and second switches. The timing module can be configured to control the second switch such that the second switch is closed to conduct the trigger current to the gate terminal of the power switch and so that the second switch is opened to stop conduction of the trigger current to the gate terminal and permit conduction of the electric energy to the charging device.

In one aspect, the gate drive unit also includes a third switch conductively coupled with the charging device and the gate terminal of the power switch such that the third switch is between the charging device and the gate terminal of the power switch. The timing module can be configured to control the third switch such that the third switch is closed to prevent conduction of the trigger current from the charging device to the gate terminal of the power switch.

In one aspect, the gate drive unit also includes a dampening resistive element conductively coupled with the third switch and the gate terminal of the power switch such that the dampening resistive element is between the third switch and the gate terminal. The dampening resistive element can reduce oscillations in the trigger current when the trigger current is conducted into the gate terminal of the power switch.

In one aspect, the gate drive unit also includes a freewheeling diode conductively coupled with the gate terminal of the power switch and with the charging device. The gate terminal of the power switch can be conductively coupled with the freewheeling diode and the charging device in a location that is between the charging device and the freewheeling diode. The freewheeling diode can be configured to conduct the trigger current from the charging device but prevent the electric energy from the power supply from being conducted into the gate terminal of the power switch.

In one aspect, the gate drive unit also includes a third switch and a fourth switch conductively coupled with the electric energy source and the freewheeling diode such that the freewheeling diode is conductively coupled with the third switch and the fourth in a location between the third switch and the fourth switch. The one or more timing modules can close the first switch and the fourth switch to direct the electric energy through the freewheeling diode to the charging device to charge the charging device. The one or more timing modules can close the second switch to conduct the trigger current into the gate terminal of the power switch, and the one or more timing modules can at least one of open the third switch or close the fourth switch to stop conduction of the trigger current into the gate terminal of the power switch.

In another example of the inventive subject matter described herein, a method for controlling a gate drive unit includes activating a charging switch in the gate drive unit to conduct a charging current from an electric energy source to a charging device of the gate drive unit. The charging current charges the charging device with electric energy. The method also includes, responsive to an amount of the electric energy stored in the charging device reaching or exceeding a designated upper limit, deactivating the charging switch and activating a discharge switch in the gate drive unit to discharge the electric energy stored in the charging device as a trigger current. The trigger current can be conducted to a gate terminal of a power switch to activate the power switch. The method also can include, responsive to the power switch being activated by the trigger current, deactivating the discharge switch to prevent further conduction of the trigger current to the gate terminal from the charging device and closing a dissipation switch to discharge a remaining amount of the electric energy stored in the charging device away from the gate terminal of the power switch.

In one aspect, the method also includes preventing conduction of the charging current to the gate terminal of the power switch using a freewheeling diode conductively coupled with the charging device.

In one aspect, activating the discharge switch includes closing a switch conductively coupled with the energy source and the charging device between the energy source and the charging device. The charging device can be conductively coupled with the charging switch and the discharge switch in a location that is between the charging and discharge switches.

In one aspect, the method also can include reducing oscillations in the trigger current when the trigger current is conducted into the gate terminal of the power switch by conducting the trigger current through a dampening resistive element conductively coupled with the dissipation switch and the gate terminal of the power switch such that the dampening resistive element is between the dissipation switch and the gate terminal.

In another example of the inventive subject matter described herein, another gate drive unit includes an inductive device, a first switch, and a second switch. The inductive device is configured to store electric energy when the inductive device receives a charging current from an electric energy source, the inductive device also configured to discharge the electric energy that is stored in the inductive device as a trigger current that is conducted to a gate terminal of a thyristor device to activate the thyristor device. The first switch is conductively coupled with the energy source and the inductive device between the energy source and the inductive device. The second switch is conductively coupled with the inductive device and the energy source between the inductive device and the energy source. The first switch is configured to be closed while the second switch is open to conduct the charging current from the energy source to the inductive device until the inductive device is charged with at least a designated upper level of the electric energy. The first switch also is configured to open when the second switch closes to discharge the electric energy that is stored in the inductive device to the gate terminal of the thyristor device as a trigger current that activates the thyristor device.

In one aspect, the gate drive unit also includes a third switch conductively coupled with the inductive device and an anode terminal of the thyristor device. The third switch is configured to close to charge the inductive device with the charging current, to open to discharge the electric energy stored in the inductive device as the trigger current, and to close when the second switch is opened to dissipate a remaining amount of the electric energy stored in the inductive device.

In one aspect, the third switch is configured to open before the first switch opens to initiate discharge of the trigger current from the inductive device while the charging current continues to charge the inductive device.

In one aspect, the gate drive unit also includes a dampening resistive element conductively coupled with the third switch and the anode terminal of the thyristor device. The dampening resistive element can be configured to reduce oscillations of the trigger current.

In one aspect, the second switch is configured to open prior to complete dissipation of the electric energy stored in the inductive device.

In one aspect, the gate drive unit also includes a freewheeling diode conductively coupled with the inductive device and the energy source. The freewheeling diode can be configured to prevent conduction of the charging current from the energy source to the gate terminal of the thyristor device.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

This written description uses examples to disclose several embodiments of the inventive subject matter and also to enable a person of ordinary skill in the art to practice the embodiments of the inventive subject matter, including making and using any devices or systems and performing any incorporated methods. The patentable scope of the inventive subject matter is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

What is claimed is:

1. A gate drive unit comprising:
    a charging device conductively coupled with an electric energy source and a power switch between the electric energy source, the power switch configured to be switched between an ON state and an OFF state to control conduction of electric current from a power supply to a load, the charging device configured to store electric energy supplied by the electric energy source when the electric energy is conducted to the charging device;
    a first switch conductively coupled with the electric energy source and the charging device between the electric energy source and the charging device, the first switch configured to close to conduct the electric energy from the electric energy source to the charging device, the first switch configured to open to prevent conduction of the electric energy from the electric energy source to the charging device; and
    one or more timing modules coupled with the first switch and configured to control closing or opening of the first switch,
    wherein the one or more timing modules are configured to close the first switch to direct the electric energy from the electric energy source to the charging device for a designated charging time period in order to charge the charging device with the electric energy while the power switch is in the OFF state, the one or more timing modules also configured to open the first switch to cause the electric energy stored in the charging device to be conducted out of the charging device as a trigger current that is conducted to an anode terminal and extracted through a gate terminal of the power switch to activate the power switch to the ON state from the OFF state.

2. The gate drive unit of claim 1, further comprising a clamping diode conductively coupled with the charging device, the clamping diode configured to conduct the trigger current from the charging device but prevent the electric energy from the energy source from being conducted into the anode terminal of the power switch.

3. The gate drive unit of claim 1, wherein the one or more timing modules are configured to open the first switch to initiate conduction of the trigger current from the charging device to switch the power switch to the ON state and to stop charging of the charging device with the electric energy from the electric energy source.

4. The gate drive unit of claim 1, wherein the power switch is a silicon carbide thyristor with an N-P-N-P semiconductor device structure, formed from a substrate n-doped layer that is coupled with a cathode terminal of the power switch, a blocking p-doped layer that is coupled with the substrate n-doped layer, a gate n-doped layer that is coupled with the gate terminal and with the blocking p-doped layer such that the blocking p-doped layer is between the gate n-doped layer and the substrate n-doped layer, and an anode p-doped layer that is coupled with the gate n-doped layer and the anode terminal of the power switch.

5. The gate drive unit of claim 4, wherein the power switch is an asymmetric switching device that blocks conduction of electric current from the cathode terminal to the anode terminal through the substrate n-doped layer, the blocking p-doped layer, the gate n-doped layer, and the anode p-doped layer.

6. The gate drive unit of claim 1, further comprising a second switch conductively coupled with the energy source and the charging device between the energy source and the charging device, the charging device conductively coupled with the first and second switches in a location that is between the first and second switches, wherein the one or more timing modules is configured to control the second switch such that the second switch is closed to conduct the trigger current to the anode terminal and extracted through the gate terminal of the power switch and so that the second switch is opened to stop conduction of the trigger current to the gate terminal and permit conduction of the electric energy to the charging device.

7. The gate drive unit of claim 6, further comprising a third switch conductively coupled with the charging device and the gate terminal of the power switch such that the third switch is between the charging device and the gate terminal of the power switch, wherein the one or more timing modules is configured to control the third switch such that the third switch is closed to prevent conduction of the trigger current from the charging device to the anode terminal and extracted through the gate terminal of the power switch.

8. The gate drive unit of claim 7, further comprising a dampening resistive element conductively coupled with the third switch and the gate terminal of the power switch such that the dampening resistive element is between the third switch and the gate terminal, the dampening resistive element reducing oscillations in the trigger current when the trigger current is conducted into the anode terminal and extracted through the gate terminal of the power switch.

9. The gate drive unit of claim 1, further comprising a clamping diode conductively coupled with the gate terminal of the power switch and with the charging device, the gate terminal of the power switch conductively coupled with the clamping diode and the charging device in a location that is between the charging device and the clamping diode, the clamping diode configured to conduct the trigger current from the charging device but prevent the electric energy from the power supply from being conducted into the anode terminal of the power switch.

10. The gate drive unit of claim 9, further comprising a third switch and a fourth switch conductively coupled with the electric energy source and the clamping diode such that the clamping diode is conductively coupled with the third switch and the fourth switch in a location between the third switch and the fourth switch, the one or more timing modules configured to close the first switch and the fourth switch to direct the electric energy through the clamping diode to the charging device to charge the charging device, the one or more timing modules configured to close the second switch to conduct the trigger current into the anode terminal of the power switch, and the one or more timing modules configured to at least one of open the third switch or close the fourth switch to stop conduction of the trigger current into the anode terminal and extracted through the gate terminal of the power switch.

11. A method for controlling a gate drive unit, the method comprising:
   activating a charging switch in the gate drive unit to conduct a charging current from an electric energy source to a charging device of the gate drive unit, the charging current charging the charging device with electric energy;
   responsive to an amount of the electric energy stored in the charging device reaching or exceeding a designated upper limit, deactivating the charging switch and activating a discharge switch in the gate drive unit to discharge the electric energy stored in the charging device as a trigger current, the trigger current conducted to an anode terminal and extracted through a gate terminal of a power switch to activate the power switch; and
   responsive to the power switch being activated by the trigger current, deactivating the discharge switch to prevent further conduction of the trigger current to the anode terminal from the charging device and closing a dissipation switch to discharge a remaining amount of the electric energy stored in the charging device away from the anode terminal of the power switch.

12. The method of claim 11, further comprising preventing conduction of the charging current to the anode terminal of the power switch using a clamping diode conductively coupled with the charging device.

13. The method of claim 11, wherein activating the discharge switch includes closing a switch conductively coupled with the energy source and the charging device between the energy source and the charging device, the charging device conductively coupled with the charging switch and the discharge switch in a location that is between the charging and discharge switches.

14. The method of claim 13, further comprising reducing oscillations in the trigger current when the trigger current is conducted into the anode terminal and extracted through the gate terminal of the power switch by conducting the trigger current through a dampening resistive element conductively coupled with the dissipation switch and the anode terminal of the power switch such that the dampening resistive element is between the dissipation switch and the anode terminal.

15. A gate drive unit comprising:
   an inductive device configured to store electric energy when the inductive device receives a charging current from an electric energy source, the inductive device also configured to discharge the electric energy that is stored in the inductive device as a trigger current that is conducted to an anode terminal and extracted through a gate terminal of a thyristor device to activate the thyristor device;
   a first switch conductively coupled with the energy source and the inductive device between the energy source and the inductive device; and
   a second switch conductively coupled with the inductive device and the energy source between the inductive device and the energy source, wherein the first switch is configured to be closed while the second switch is open to conduct the charging current from the energy source to the inductive device until the inductive device is charged with at least a designated upper level of the electric energy, the first switch also configured to open when the second switch closes to discharge the electric energy that is stored in the inductive device to the anode terminal of the thyristor device as a trigger current that activates the thyristor device.

16. The gate drive unit of claim 15, further comprising a third switch conductively coupled with the inductive device and the anode terminal of the thyristor device, wherein the third switch is configured to close to charge the inductive device with the charging current, to open to discharge the electric energy stored in the inductive device as the trigger current, and to close when the second switch is opened to dissipate a remaining amount of the electric energy stored in the inductive device.

17. The gate drive unit of claim 16, wherein the third switch is configured to open before the first switch opens to initiate discharge of the trigger current from the inductive device while the charging current continues to charge the inductive device.

18. The gate drive unit of claim 16, further comprising a dampening resistive element conductively coupled with the third switch and the anode terminal of the thyristor device, the damping resistive element configured to reduce oscillations of the trigger current.

19. The gate drive unit of claim 15, wherein the second switch is configured to open prior to complete dissipation of the electric energy stored in the inductive device.

20. The gate drive unit of claim 15, further comprising a clamping diode conductively coupled with the inductive device and the energy source, the clamping diode configured to prevent conduction of the charging current from the energy source to the anode terminal of the thyristor device.

* * * * *